United States Patent
Ozawa et al.

(10) Patent No.: US 6,224,249 B1
(45) Date of Patent: May 1, 2001

(54) COMPOUND DESIGN SYSTEM AND METHOD FOR MECHANISM PARTS

(75) Inventors: Hiroshi Ozawa, Abiko; Koki Shiohata, Ibaraki-ken; Takashi Yamaguchi, Ibaraki-ken; Honami Kitano, Ibaraki-ken, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/121,514

(22) Filed: Sep. 16, 1993

(30) Foreign Application Priority Data

Sep. 17, 1992 (JP) .................................................. 4-247629

(51) Int. Cl.$^7$ ...................................................... G06F 17/50
(52) U.S. Cl. .................... 364/512; 364/468; 364/474.03; 364/474.13; 364/474.24
(58) Field of Search .................................... 364/149, 512, 364/150, 151, 468, 469, 474.03, 5, 13, 14, 23, 24

(56) References Cited

U.S. PATENT DOCUMENTS

| | | | |
|---|---|---|---|
| 5,249,151 | * 9/1993 | Chang et al. | 364/474.24 |
| 5,268,999 | * 12/1993 | Yohoyama | 364/474.24 |
| 5,297,057 | * 3/1994 | Kramer et al. | 364/512 |
| 5,339,247 | * 8/1994 | Kirihara et al. | 364/468 |
| 5,351,196 | * 9/1994 | Sowar et al. | 364/474.24 |

FOREIGN PATENT DOCUMENTS

3129476 * 6/1991 (JP) .

OTHER PUBLICATIONS

D.M.A. Lee et al., Computer–Aided Engineering Jpurnal October1990, pp. 141–148*
Watanabe et al., Proceeding of 68th Conference of the Japan Society of Mechanical Engineers, Sep. 1990, vol. E, pp. 42–44.*
Society of Mechanical Engineers, Sep. 1990, vol. E, 42–44.*

* cited by examiner

Primary Examiner—Ellis B. Ramirez
Assistant Examiner—Hal D. Wachsman
(74) Attorney, Agent, or Firm—Antonelli, Terry, Stout & Kraus, LLP

(57) ABSTRACT

A drawing apparatus is connected to a compound design apparatus. The design apparatus includes at least a display for displaying a drawing, a data base device for storing therein reference data to analyze the drawing, a storage for storing therein analysis data of the drawing, and a computing unit connected to the drawing apparatus to analyze the drawing. The computing unit may include a drawing evaluating section for extracting a graphic image of a particular mechanism part from the drawing generated by the drawing apparatus and for evaluating the graphic image, an analysis model generator for generating, according to a profile of the graphic image, an analysis model having a mechanism equivalent to the graphic image, an analyzer for reading mechanical characteristic data from the data base device, supplying the data to the analysis model, and analyzing the mechanism, and an analysis evaluating section for evaluating analysis results attained from the analyzer. The analysis results evaluated by the evaluating section are delivered to the drawing evaluating section, thereby evaluating the mechanism part graphic image.

6 Claims, 22 Drawing Sheets

FIG. IA
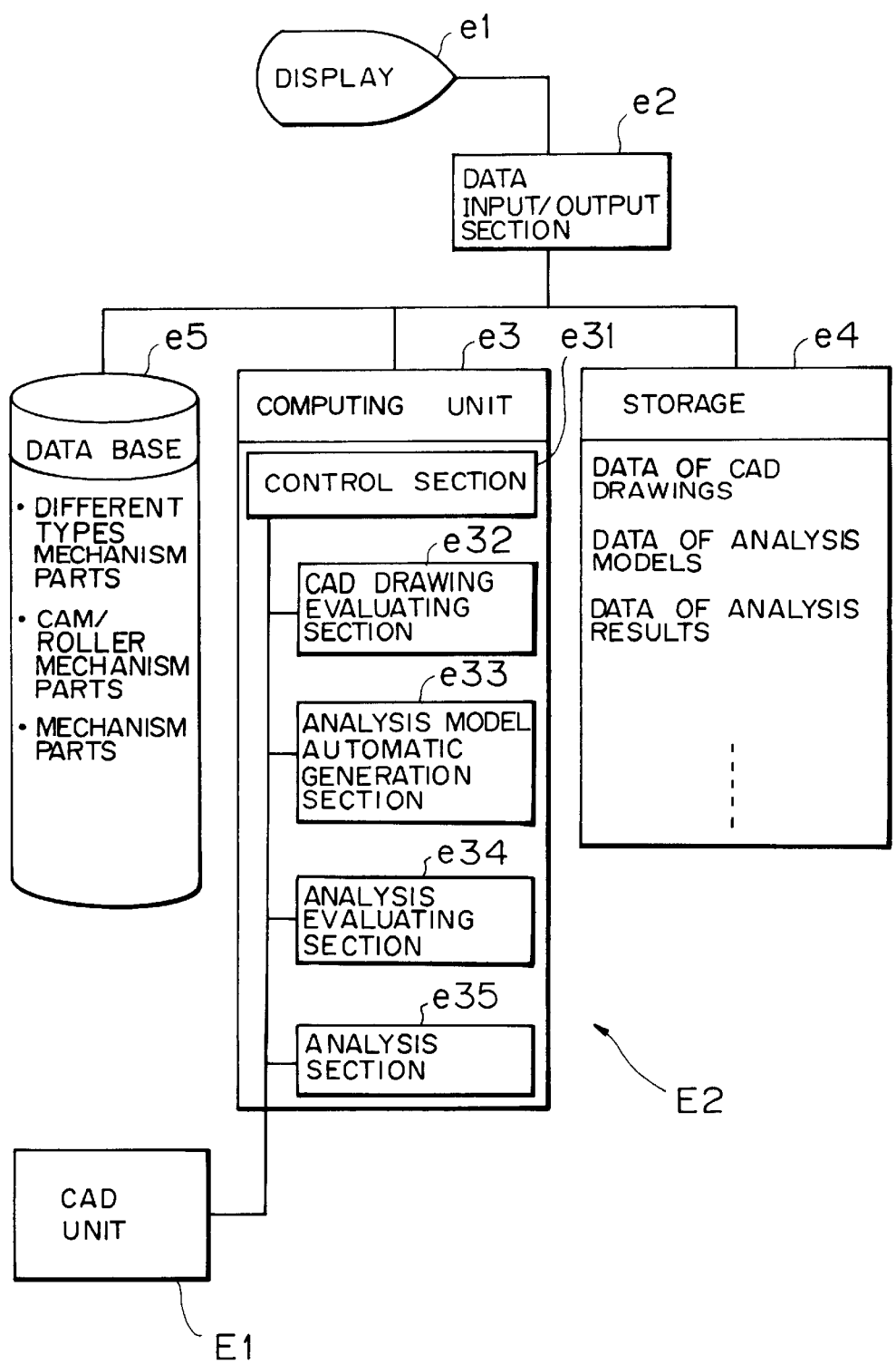

FIG.3A
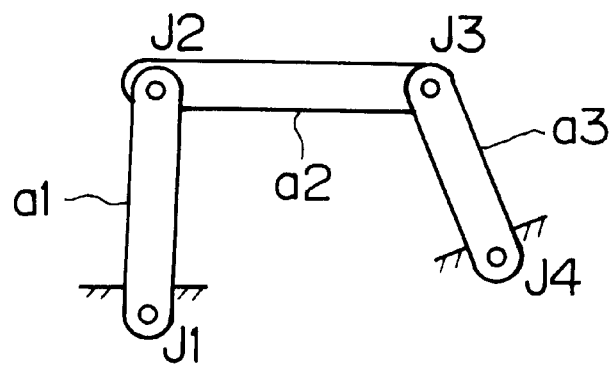
FIG.3B
| J 1 | J 2 |
|---|---|
| (J1, b, a1) | (J2, a1, a2) |
| J 3 | J 4 |
| (J3, a2, a3) | (J4, b, a3) |
FIG.3C
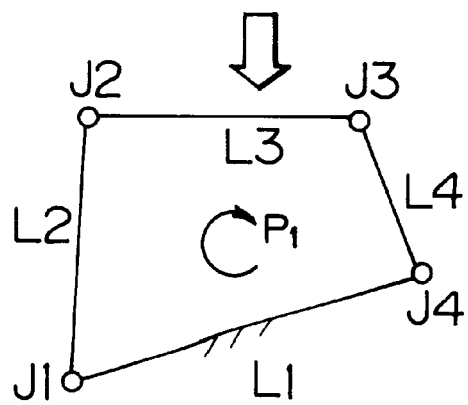

FIG.5A
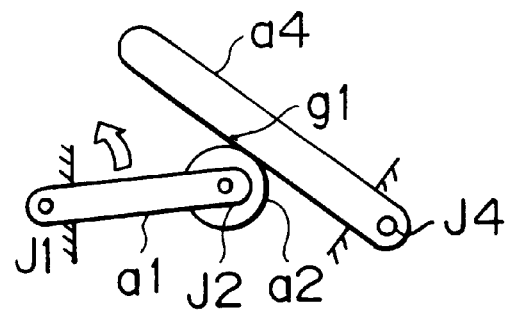
FIG.5B
| J 1 | J 2 |
|---|---|
| (J1, b, a1) | (J2, a1, a2) |
| g 1 | J 4 |
| (g1, a2, a4) | (J3, b, a4) |
FIG.5C
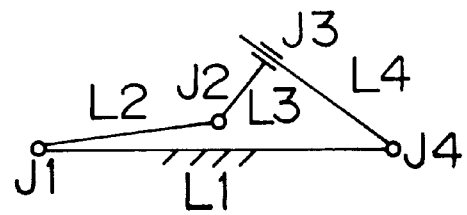

FIG. 9

| ITEM | INPUT DATA | BASIC MODEL PROFILE |
|---|---|---|
| SPRING | BOTH ENDS | L1 L2<br>J1 J2 J3<br>① Li : LINK NO.<br>② Ji : JOINT NO.<br>③ J1, J3 : ROTARY JOINT<br>④ J2 : SLIDING JOINT<br>⑤ ○ : JOINT POSITION |
| SOLENOID | PLUNGER, SLIDING DIRECTION<br>PLUNGER PART | L1<br>J1<br>① Li : LINK NO.<br>② Ji : JOINT NO.<br>③ J1 : SLIDING JOINT<br>④ ○ : JOINT POSITION<br>⑤ J1 : FIXED POINT |
| COMBINATION OF ROLLER / LINK | LINK PART<br>CENTER OF ROLLER<br>LINK PART<br>ROTARY CENTER OF LINK | J3<br>L1 L2<br>J1 J3 K1<br>① Li : LINK NO.<br>② Ji : JOINT NO.<br>③ Ki : DIRECTION INDICATING POINT<br>④ ○ : JOINT POSITION |
| COMBINATION OF ROLLER / CAM | ROLLER PART<br>CENTER OF ROLLER<br>ROTARY CENTER<br>CAM PROFILE LINE | J3 L3<br>L1 L2<br>J1 J2 K1<br>① Li : LINK NO.<br>② Ji : JOINT NO.<br>③ Ki : DIRECTION INDICATING POINT<br>④ ○ : JOINT POSITION<br>⑤ Ji : FIXED POINT<br>⑥ J2 : SLIDING JOINT<br>⑦ ○ : JOINT POSITION<br><br>L1 L2<br>J1 J2<br>① Li : LINK NO.<br>② Ji : JOINT NO.<br>③ ○ : JOINT POSITION<br>④ J1 : FIXED POSITION |

: TO BE SPECIFIED AS MANY AS THERE ARE MODELS

FIG. 15

| CONDITION | EXAMPLE OF GRAPHIC IMAGE | |
|---|---|---|
| JOINT WITH WIDE RANGE | (trapezoid with vertices J1, J2, J3, J4; sides L1, L2, L3, L4; angles $\theta_1$ at J1, $\theta_2$ at J4) | $L2 < L4$<br>MOVEMENT RANGE: $\theta_1 > \theta_2$<br>⇩<br>J1 : INDEPENDENT VARIABLE |
| OPERABLE AS DRIVING POINT | (diagram with J1 rotating, J2 sliding, J3, J4 rotating) | J1 : NOT TO BE DRIVEN<br>J4 : TO BE DRIVEN<br>⇩<br>J4 : INDEPENDENT VARIABLE |
| | (diagram with J1 rotating, J2, J3, J4 sliding) | J1 : NOT TO BE DRIVEN<br>J4 : TO BE DRIVEN<br>⇩<br>J4 : INDEPENDENT VARIABLE |
| COMMON POINT OF LOOPS | (two-loop diagram with joints J1, J2, J3, J4, J5, J6, J7) | J4 : INDEPENDENT VARIABLE |

—o— : ROLLING JOINT

—I— : SLIDING JOINT

ANALYSIS MODEL A

ANALYSIS MODEL B

| | COMPUTATION CONDITION |
|---|---|
| C1 | SMALL NUMBER OF LOOPS |
| C2 | CONDUCT MULTI-MODEL ANALYSIS |
| C3 | ACHIEVE ONLY STATIC ANALYSIS |
| C4 | RESTRICTION OF COMPUTATION TIME |
| C5 | HIGH - PRECISION ANALYSIS |
| ⋮ | ⋮ |

| | CONDITION OF LOOP |
|---|---|
| D1 | INDEPENDENT VARIABLE |
| D2 | SMALL NUMBER OF LINKS (IN LOOP) |
| ⋮ | ⋮ |

EXAMPLE OF RULE

IF (C1) AND (C4), (D2)
IF (C5), (D1)
IF (C2) AND (C3), (D1)

COMPOUND DESIGN SYSTEM AND METHOD FOR MECHANISM PARTS

BACKGROUND OF THE INVENTION

The present invention relates to a compound design system in which an interactive drawing or drafting apparatus is directly connected to a complex design apparatus for generating an analysis model of mechanism parts according to drawings or drafts and producing complete drawings based on results of an analysis conducted on the analysis model.

In a conventional analysis input/output system, a system for inputting/outputting computer aided design (CAD) drawings created by a drawing apparatus (such as manufacturing and scheme drawings) is not directly coupled with an analysis system for the following reason. Namely, when the drawing system is linked with individual analysis systems, the overall system exceeds an appropriate size and hence cannot be properly used as a general-purpose system. To overcome this difficulty, data of CAD drawings is generally fed via files to the analysis input/output system to generate an analysis model based on the data. An example of this kind has been described in pages 141 to 148 of the "Computer-Aided Engineering Journal", October 1990, by D. M. A. Lee, et al. Specifically, in accordance with this method, a three-dimensional (3D) profile is produced according to three kinds of drawings such as a front view, a side view, and a plan or top view, thereby creating a 3D analysis robot model.

On the other hand, there has been known a method in which behavior of a cam mechanism is analyzed according to an equation of a contour outline of a cam representing a locus of a contact point between the cam and a following link subordinate thereto and a restraint condition of the link. An example of this method has been described in pages 42 to 44 of the "Proceedings of 68th Conference of the Japan Society of Mechanical Engineers", September 1990, Vol. E by Katsumi WATANABE, et al.

In addition, a method of and an apparatus for analyzing dynamic behavior of a link mechanism has been described in the JP-A-3-129476.

SUMMARY OF THE INVENTION

It is therefore an object of the present invention to provide a compound design system and a compound design method in which mechanism parts are analyzed according to a drawing, draft, or diagram generated from a drawing apparatus to thereby easily produce an analysis model based on an analysis result.

According to one aspect of the present invention, a compound design system includes a drawing apparatus and a compound design apparatus for analyzing, in association with the drawing apparatus, a mechanism of a compound mechanism system of different mechanism parts and processing a result obtained from the analysis. The compound design apparatus includes an analysis model generating device for automatically generating, based on profiles of mechanism parts thus drawn, an equivalent link mechanism analysis model, an analysis evaluating device for converting the mechanism analysis model into data for analysis and transforming a result of an analysis into two-dimensional data, an analysis device for executing a mechanism analysis, and a drawing evaluating device for generating data to correct a result of the mechanism analysis and the drawing.

The analysis model generating apparatus produces a link mechanism model according to conditions including a contour, a dimension, a manufacturing precision, and assembly precision of each of the mechanism parts. Alternatively, the apparatus may create a link mechanism model configured with an optimal loop with respect to analysis precision and analysis time according to a profile and a posture of a link.

Furthermore, the compound design apparatus includes a first operation to associate different mechanism parts with an equivalent mechanism model, a second operation to associate drawing data with data of a mechanism analysis model, and a third operation to control data associating the drawing with a graphic image of a mechanism analysis model. The first operation includes a program to control data of line elements constituting mechanism parts, a program to associate the line element data with an equivalent link mechanism model, and data items representing profiles and dimensions. In addition, the first operation may include a program to identify a kind of each of the parts in the drawing.

Moreover, the compound design apparatus may include an automatic model generating device for generating a three-dimensional mechanism analysis model according to joints and restrictions between the mechanism parts described in at least either one of a front view, a plan view, a side view, and a cross-sectional view represented in two dimensions.

According to another aspect of the present invention, there is provided a compound design method for use with a drawing apparatus for analyzing a mechanism of a compound mechanism system of different mechanism parts and processing a result of the analysis. According to the method, for a combination of different parts, data identifying the combination of parts is read from an analysis model data control table and then a retrieval is conducted, according to the identifying data, through a data table corresponding to the analysis model data base, thereby automatically generating, according to the mechanism parts, an analysis model including links and joints.

In the compound design system according to the first aspect of the present invention, the compound design apparatus at least includes a display for displaying thereon a drawing, a data base device for storing therein reference data to conduct analyses based on the drawing, a storage for storing therein analysis data input according to the drawing, and a computing unit connected to a drawing apparatus for executing an analysis based on the drawing. The computing unit may include a drawing evaluating device for extracting a graphic image of a particular mechanism part from a drawing received from the drawing apparatus and evaluating the graphic image, an analysis model generating device for generating, according to a profile of the graphic image of the mechanism part, an analysis model having a mechanism equivalent to the graphic image, an analysis device for reading data of mechanical characteristics from the data base device, applying the data to the analysis model, and thereby executing a mechanism analysis, and an analysis evaluating device for evaluating an analysis result obtained from the analyzing apparatus. The analysis result thus evaluated by the analysis evaluating device is supplied to the drawing evaluating device, thereby evaluating the graphic image of the mechanism part.

In the data base device, there are at least stored selection rules of independent variables of joints respectively of different kinds of link mechanism parts, and cam-roller mechanism parts, and link mechanism parts, the variables being represented at least with angles and values denoting sliding amount.

The analysis model generating device extracts, when it is possible to extract structure data from the graphic image, objective structure data and accordingly selects independent variables stored in the data base device so as to obtain link mechanism part data related to the independent variables, thereby creating an analysis model having a mechanism equivalent to the link mechanism part data. Moreover, the analysis model generating device achieves a retrieval, when it is impossible to extract structure data from the graphic image, for a mechanism part graphic image similar to that stored in the data base device, generates structure data according to the graphic image thus obtained as a result of the retrieval, and then selects according thereto independent variables stored in the data base device so as to extract link mechanism part data related to the independent variables, thereby generating an analysis model having a mechanism equivalent to the link mechanism part data.

The compound design method according to the other feature of the present invention may include the following steps of extracting a graphic image of a particular mechanism part from the drawing generated by the drawing apparatus, generating an analysis model having a mechanism equivalent to the graphic image according to a contour of the graphic image, reading data of mechanical characteristics from a data base device, applying the data to the analysis model to execute a mechanism analysis, evaluating a result of the analysis, and correcting the graphic image according to the analysis result thus evaluated.

In the creation of the analysis model, when structure data can be extracted from the mechanism part graphic image, there are selected independent variables represented with at least angles and amounts of sliding related to joints of link mechanism parts stored in the data base device according to structure data extracted from the graphic image. Thereafter, there is extracted data of the link mechanism part graphic image associated with the independent variables so as to produce an analysis model having a mechanism equivalent to the extracted data of the link mechanism part graphic image. Furthermore, it may also be possible, when structure data cannot be extracted from the mechanism part graphic image, to carry out a retrieval for a mechanism part graphic image similar to that stored in the data base device so as to create structure data according to the mechanism part graphic image selected as a result of the retrieval. Using the selection rules of the independent variables represented by at least angles and amounts of sliding related to joints of link mechanism parts stored in the data base device according to structure data thus generated, there may be extracted data of the link mechanism part graphic image associated with the independent variables, thereby producing an analysis model having a mechanism equivalent to the extracted data of the link mechanism part graphic image.

Due to the apparatus constitution set forth above, to design a mechanism system including links and other mechanism parts, a drawing apparatus and a compound design apparatus are directly connected to each other so that an analysis model is automatically generated from a drawing produced by the drawing apparatus. Consequently, even a beginner not versed in the creation of analysis models could easily conduct simulations of, for example, a mechanism analysis. Moreover, a result of analysis conducted according to the analysis model through the simulation can be immediately used to modify the drawing.

BRIEF DESCRIPTION OF THE DRAWINGS

These and other objects and advantages of the present invention will become apparent by reference to the following description and accompanying drawings wherein:

FIG. 1A diagram showing the configuration of a compound design system of mechanism parts in an embodiment according to the present invention;

FIGS. 3A to 3C are diagrams used to explain a sequence of producing an analysis model of mechanism parts;

FIGS. 5A to 5C are diagrams used to explain an order of producing an analysis model of other mechanism parts;

FIG. 9 is a diagram used to explain examples of data items of various mechanism parts stored in a data base;

FIG. 15 is a diagram for explaining a commonly used, example rules used to select independent variables stored in a data base;

DESCRIPTION OF THE PREFERRED EMBODIMENTS

Referring now to the accompanying drawings, description will now be given of embodiments according to the present invention.

FIG. 1A shows the structure of a compound design system of mechanism parts according to the present invention. The system includes a CAD drawing apparatus E1 and a compound design apparatus E2 for achieving a design of mechanism parts. For the apparatus E1, there may be employed a commonly used, ordinary drawing device. The apparatus E2 includes a display e1 having a display screen, a data input/output section e2 for achieving data input and output operations according to display data presented on the display e1, a computing unit e3 for generating an analysis model according to CAD drawings or drafts created by the apparatus E1, a storage e4 for storing therein data such as analysis results produced according to the analysis model prepared by the computing unit e3, and a data base e5 storing therein reference data including data items of mechanism parts.

The computing unit e3 serves as an essential device in accordance with the present invention and includes a control part e31 to control processing of the computing unit e3, a CAD drawing evaluating part e32 for receiving a CAD drawing created by the apparatus E1, extracting data therefrom, and evaluating the CAD drawing according to an analysis result of an analysis model generated later, an analysis model automatic generating part e33 for producing an analysis model of mechanism parts according to the data of CAD drawings, an analysis evaluating part e34 for extracting data from the analysis model, transforming the data into codes to be processed by an analysis program, and transferring a result of the data of the analysis model to be executed next to the evaluating part e32, and an analysis part for analyzing the data of the analysis model, for example, an operation range, an operation speed, and a characteristic of a mechanism part thus transformed into the analysis model and transferring data resultant from the analysis to the evaluating part e34. The data is then analyzed by the evaluating part e34 and is transferred to the CAD evaluating part e32. In this part, the data is presented on the display e1 such that the CAD drawing is corrected via the data input/output section e2. The resultant CAD drawing is again fed from the CAD evaluating section e32 to the model generator e33, which in turn generates an analysis model to repeatedly conduct the analysis. In a case where the reference data of mechanism parts are required, pertinent data is read from the data base e5 to be used in the creation of an analysis model and in an analysis of data of the analysis model. Data items of the CAD drawing, the analysis model, and the data resultant from the analysis are stored in a temporary or work file in a storage 4 or are saved in the data base e5.

Figure 1B:
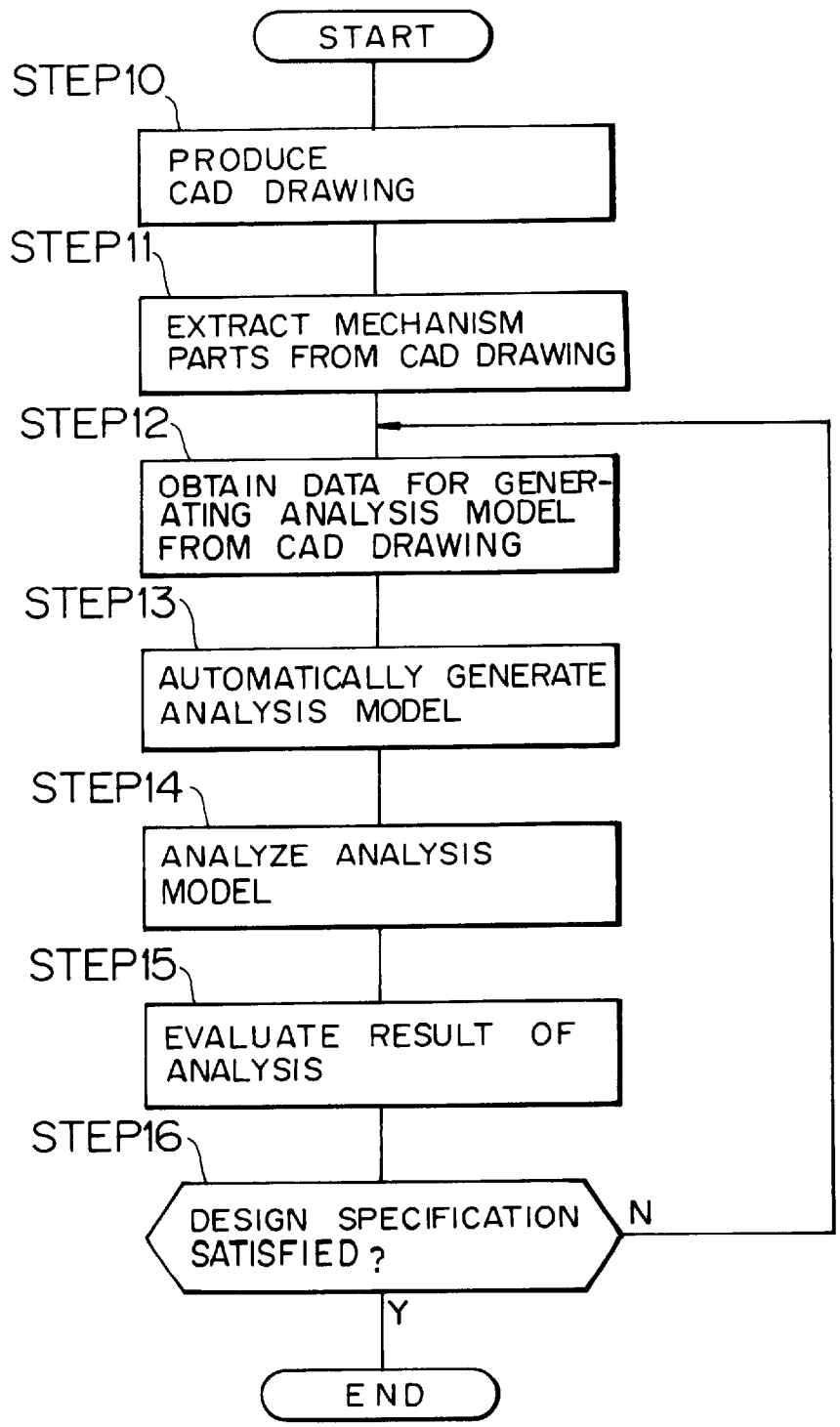
FIG. 1B is a flowchart showing an outline of operation of the compound design system.

FIG. 1B is a flowchart showing an outline of operation of the compound design system. First, in step 10, a CAD drawing of mechanical parts is generated by the apparatus E1. In step 11, mechanism parts are extracted from the mechanical parts of the drawing. In step 12, data necessary to produce an analysis model is extracted from the drawing. In step 13, an analysis model is automatically created according to the extracted data. In step 14, operations and other items of the generated analysis model are analyzed. In step 15, results of the analysis are evaluated according to actual design specifications. In step 16, if the analysis results do not satisfy the design specifications, control is returned to step 12; otherwise, the processing is terminated.

Figure 2:
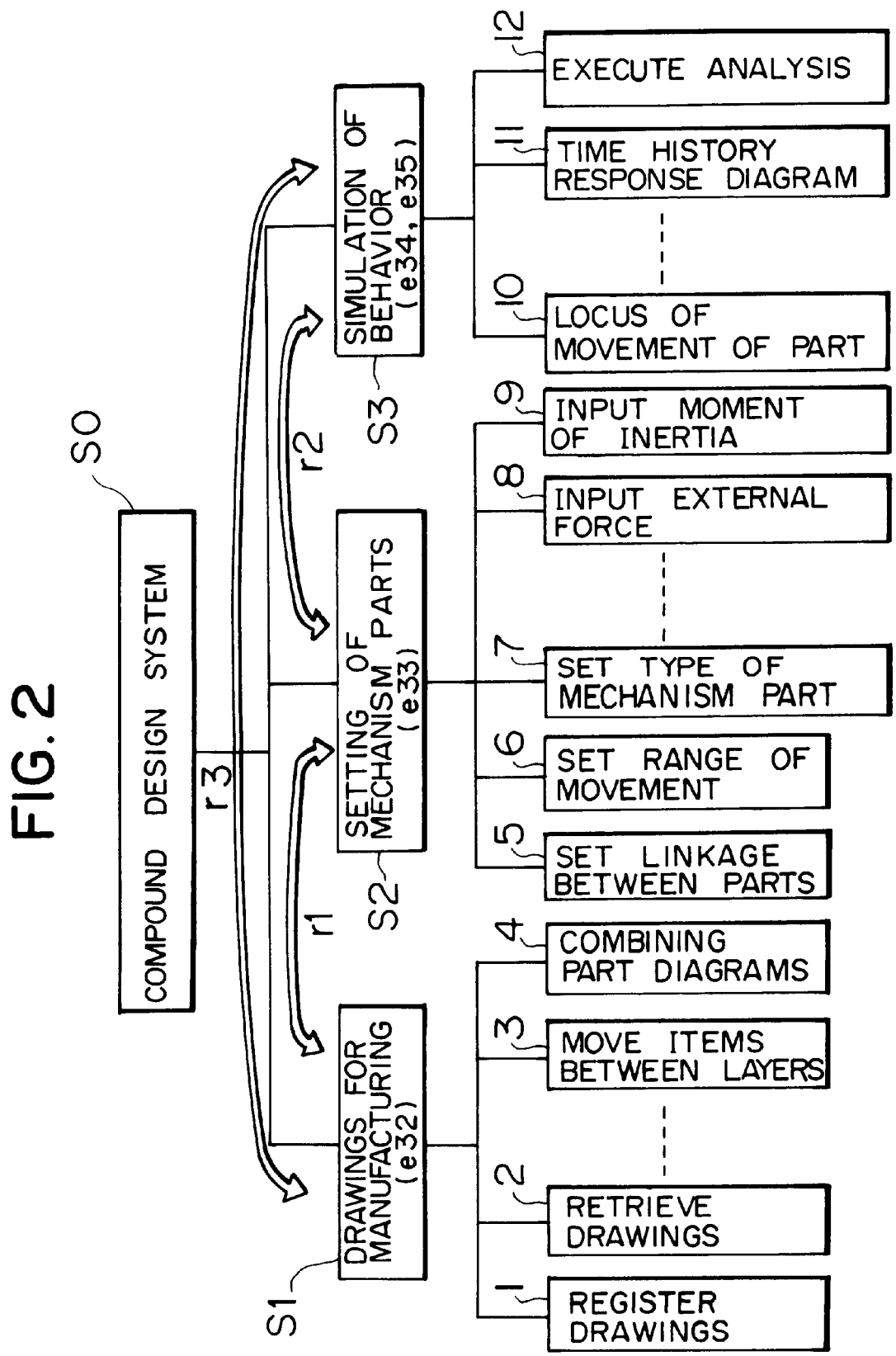
FIG. 2 is a diagram for explaining the constitution of software of the compound design system.

FIG. 2 shows a program configuration to operate the compound design system of FIG. 1A. A main program S0 supervising the system is possessed by the control part e31 of FIG. 1A. The main program S0 has subsystems including a manufacturing drawing program S1, a mechanism part setting program S2, and a behavior simulation program S3.

The programs S1 to S3 are possessed by the parts e32, e33, and e34 and e35, respectively. These programs are executed in response to data manually supplied by the operator. Namely, the operator selects, by a picking device, one of the program names interactively presented on the screen.

The program S1 is related to manufacturing drawings and helps the user to generate and to correct CAD drawings generated by the CAD drawing apparatus E1. Of the program S1, a drawing registration program 1 reads a CAD drawing generated by the apparatus E1 to load the drawing in the compound design apparatus E2. A drawing retrieval program 2 moves the drawing data thus read to the storage e4. An intra-layer move program 3 selects a data storage location (layer) for the drawing and determines a graphic image to be displayed; or, a part drawing combining program 4 specifies graphic images of a plurality of mechanism parts to a related part.

Next, the program S2 includes sub-programs such as a part linkage setting program 5, an operation range setting program 6, a mechanism part setting program 7, an external force setting program, and a moment of inertia setting program 9 so as to determine constraints such as linkages between the mechanical parts, conditions of loads, and ranges of movement. In addition, the program S3 analyzes behavior of each mechanism part determined by the program S2. In the program S3, a part operation trace program 10 analyzes a trace of movement based on the analysis results of each mechanism part according to the CAD drawing. A time history response drawing program 11 analyzes changes in the position, speed, and acceleration of each joint with respect to time.

The programs S1 to S3 are linked with each other and are executed in an arbitrary sequence. For example, using a CAD drawing retrieved by the program S1, the program S2 sets linkages between parts, and then an analysis model generated according to the linkage is used to correct the drawing by the program S1, thereby providing a processing route $r_1$ between the programs S1 and S2. Similarly, there may be arbitrarily established processing routes $r_2$ and $r_3$ between the programs S2 and S3 and between the programs S3 and S1, respectively. As set forth above, the programs S1 to S3 cooperate with the apparatus E1 to implement a design system of mechanical parts.

Next, operation of the program S2 will be described. First, description will be given of the basic operation thereof according to a four-bar link mechanism as an example of a mechanism including mechanism parts. In FIGS. 3A to 3C and subsequent diagrams, joints the mechanism are denoted as J1, J2, J3, etc. A first member, a second member, a third member, etc. thereof are respectively designated as a1, a2, a3, etc. for links as well as rollers.

FIGS. 3A to 3C show an outline of an order of generating an analysis model from a CAD drawing of the four-bar link mechanism. In the CAD drawing shown in FIG. 3A, the link members a1 and a2 are rotatively linked with stationary members respectively associated therewith. The link member a2 is rotatively coupled with the link members a1 and a3. To obtain the analysis model of FIG. 3C from the drawing of FIG. 3A, four instructing operations are required. Namely, in response thereto, the model is automatically created by a compound design system program S0.

Joints as connecting points between the links or between the links and the stationary members are set according to link data of the CAD drawing by the part linkage setting program 5 of FIG. 2. The joints are set as follows. For example, after denoting a coupling point of the joint J1 in the drawing of FIG. 3B, the user inputs data b (blank) denoting a stationary member from a keyboard and designates a portion of the link member a1 in the CAD drawing. As a result, the program sets the joint J1 as one of the joint data items on both ends of the link L2 of the analysis model.

In this operation, there are input coordinate values of a position of the joint J1, a kind thereof, namely, identification data representing "rotation", and a fixed-point flag designating the joint J1. Moreover, specifying or obtaining points associated with the joint J2 and the link members a1 and a2 in the drawing, there is established the joint J2 connecting the link L2 to the link L3 in the analysis model. The operations are repeatedly carried out in a similar manner to set the joints J3 and J4 such that according to the data items thus set, there is automatically created the analysis model of the four-bar link mechanism as shown in FIG. 3C.

A process of producing data of the analysis model of FIG. 3C will now be described by reference to FIGS. 3A to 3C.

Figure 3D:
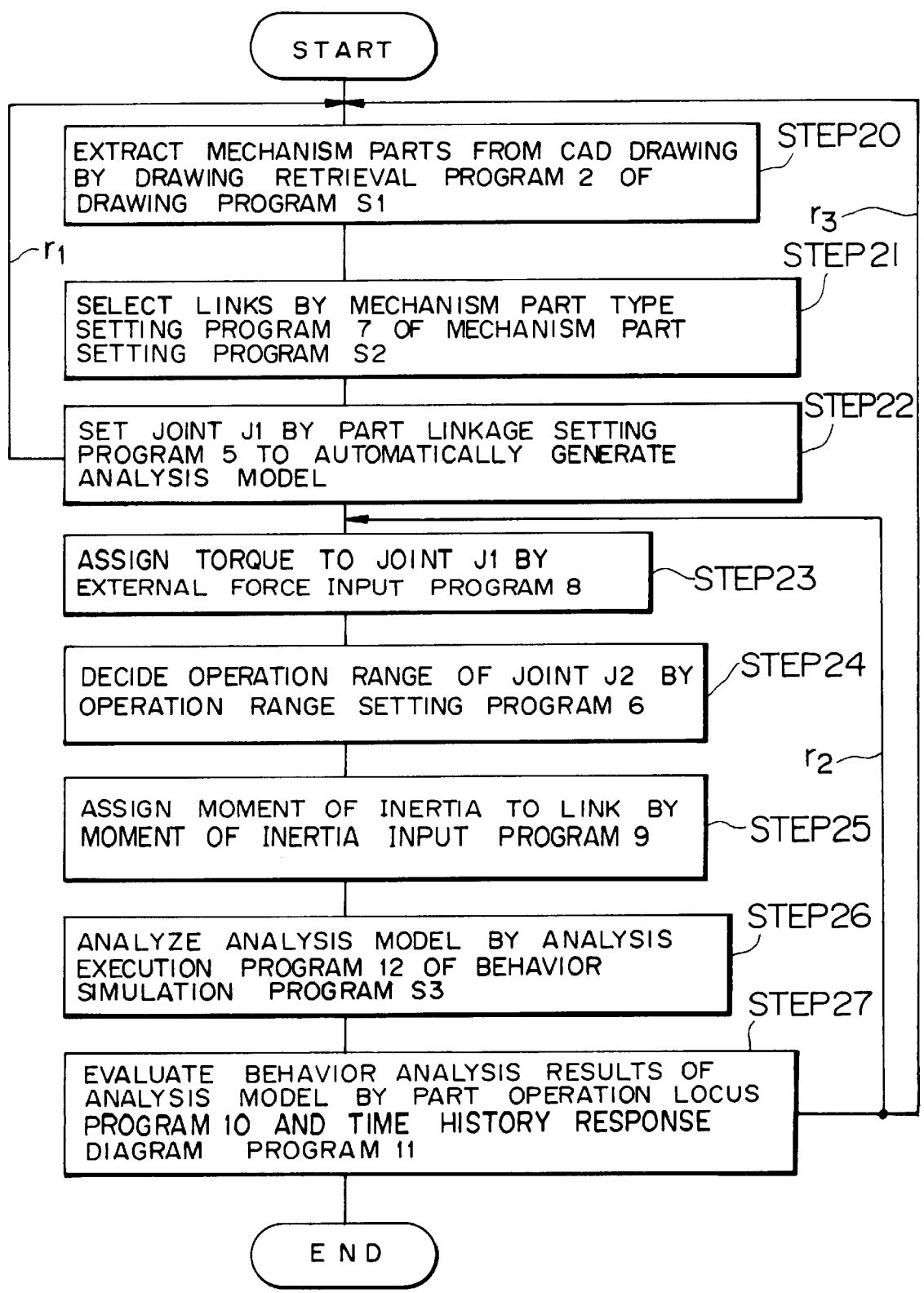
FIG. 3D is a flowchart for explaining, in association with execution of the software of FIG. 2, a procedure of creating the analysis model of FIGS. 3A to 3C.
Figure 4:
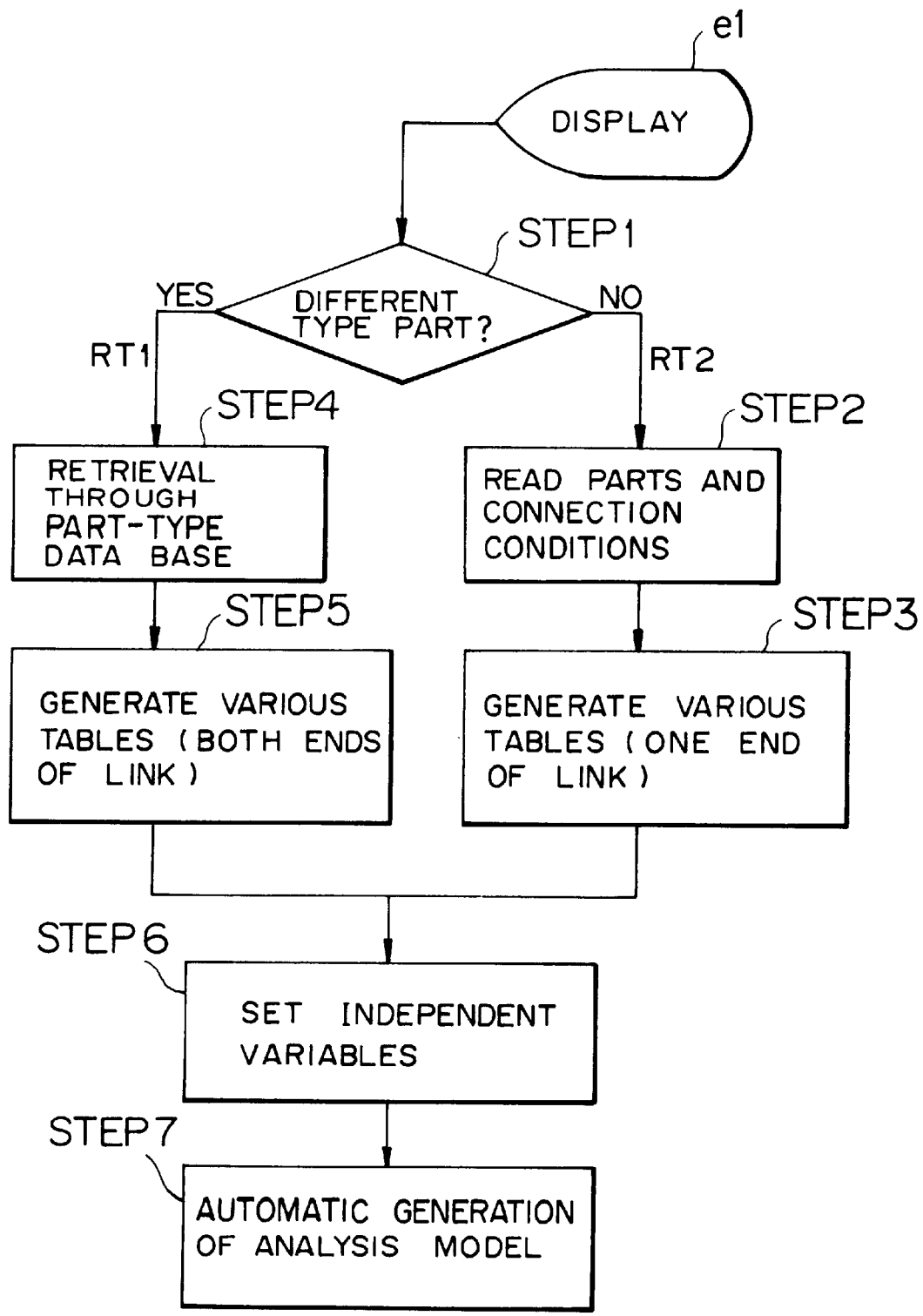
FIG. 4 is a flowchart showing an operation sequence for generating an analysis model.
Figure 18:
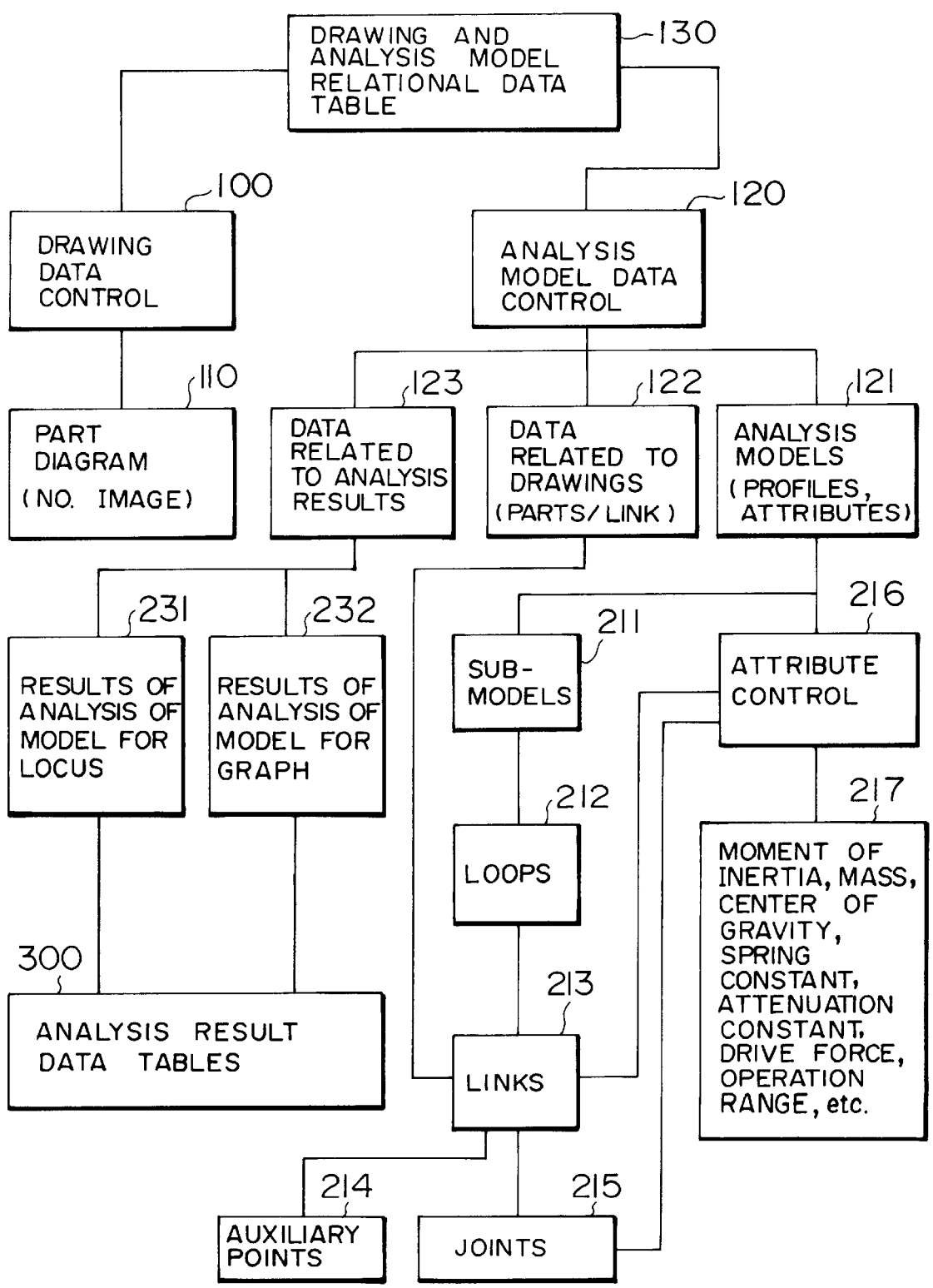
FIG. 18 is a diagram showing the data structure in a storage shown FIG. 1.

In a case where a part shape of a mechanism part input via the CAD drawing apparatus E1 is a link part, processing of a processing route RT2 of FIG. 4 is executed to produce an analysis model. First, in step 1, since the mechanism part belongs to a typical link mechanism, it is determined that the part is not of the different-type parts. In step 2, a number assigned to the joint and numbers assigned to two links to be coupled with the joint, which are set by the program 5, are read from the data of CAD drawing. Next, in step 3, for each number of the links connected to the joint, a joint number is written as an end point of each link in a link/joint relation table (FIG. 18). The table is associated with link data 212 and joint data 214 shown in FIG. 18 and will be described later. In the example of FIGS. 3A to 3C, as a result of execution of the program 5 for the four connecting points, the joint numbers assigned to both end points of each of the links L2 to L4 of the analysis model of FIG. 3 corresponding to the link members a1 to a3 of the CAD drawing of FIG. 3A are written in a link/joint relation table associated with the pertinent link. Finally, in association with the link L1 related to the fixed joints J1 and J4, joint and link numbers are written in the table. As a result, the joint and link numbers are written in the table along the direction of the loop pl indicated by an arrow mark in FIG. 3C. In concurrence therewith, for each joint, a two-dimensional coordinate value table and a loop/link relation table are filled up with data items. The two-dimensional coordinate value table is related to the joint data 215 of FIG. 18, whereas the loop/link relation table is associated with loop data 212 and link data 213. Next, an operational condition and restraints of the mechanism system specified for shapes of parts of the CAD drawing are converted into data items corresponding to the joints and the links set beforehand. The data items of the links (such as joint and/or link numbers) and attribute data items (operational and restraint conditions) respectively assigned to the joints and links are written in the attribute data table. Through steps 6 and 7, data items of the analysis model for the mechanism parts are automatically generated. Processing of the steps 6 and 7 will be described in detail later. As set forth above, a relatively simple analysis model as shown in FIG. 3 is generated through the processing of the route RT2 of FIG. 4.

The production of the analysis model of mechanism parts related to FIGS. 3A to 3C will now be more specifically described according to the software system of FIG. 2 by reference to FIG. 3D. In step 20, mechanism parts are extracted from the CAD drawing of mechanical parts shown in FIG. 3A by the drawing retrieval program 2 of the manufacturing drawing program S1. In step 21, links are selected from the mechanism parts by the parts type setting program 7. In step 22, according to the part linkage setting program 5, the joint J1 is set only by indicating a graphic image of the link a1 as shown in FIG. 3B. As a result, there are recognized data items denoting that the joint J1 is at a fixed position and is coupled with the link a1. Subsequently, the links a2 and a3 are similarly recognized. Through the operation described above, the analysis model of FIG. 3C is automatically created. In this situation, when it is necessary to subdivide the analysis model into two partitions or to combine two analysis models into a single model, the processing route r1 is invoked to execute the part drawing combining program 4 of the program S1 to modify the pertinent items of the model(s). In step 23, a torque value is assigned to the joint J1 in accordance with the external force input program 8. Namely, the user designates the joint J1 and then inputs a value of external force from the keyboard. In step 24, a range of operation of the joint J2 is determined by the range setting program 6. The user designates the joint J2 and then sets the range on the display e1. In step 25, a moment of inertia is assigned to each link according to the moment input program 9. In addition, parameters such as the mass, center of gravity, and the like are also specified for the respective links by program not shown. In a step 26, the analysis execution program 12 of the program S3 is initiated to analyze the analysis model according to the data items supplied in steps 23 to 25. In step 27, analysis results of behavior of the analysis model are evaluated by the trace program 10 and the response diagram program 11. When analysis conditions of the analysis model are required to be altered as a result, control is returned to step 23 to again supply data items representing mechanical characteristics as indicated by the processing route r2. Moreover, when profiles of mechanism parts are required to be varied as a result of the analysis, control is returned to the step 20 to change the part profiles extracted from the CAD diagram. In response thereto, an analysis model is again generated for a subsequent analysis. When results of the analysis satisfy the design specifications, the mechanical parts finally obtained are stored in the form of a manufacturing diagram in the data base e5 by the drawing registration program 1.

In addition to the four-bar link mechanism constituted of the link parts shown in FIG. 3A, a link mechanism associated with a rolling contact, as shown in FIG. 5A, is similarly processed through a process substantially identical to that shown in FIG. 3B so as to automatically generate an analysis model. In FIG. 5B, joints J1 to J3 are rotating joints and hence are set in the system in an operation similar to that shown in FIG. 3B. For a rolling contact, the type setting program 7 of FIG. 2 is activated to select a combination of a roller and a link. Subsequently, a tangential line g1 between the link members a2 and a3 is specified in place of joints and then portions of the CAD drawing respectively designating the link members a2 and a3 are indicated, thereby setting or deciding a position of the rolling contact. Referring now to FIGS. 5A to 5C, description will be given of the creation of an automatic analysis model of the mechanism described above, which is different from the model production described in conjunction with FIGS. 3A to 3C. In step 1, since the combination between the roller and the link is related to a different type of combination, the processing of the route RT1 of FIG. 4 is activated. In step 4, data identifying the combination is read from the CAD drawing and retrieval is made through tables of the data base e5 to acquire an analysis model of the roller and the link. In the case of this combination, for each of the roller and the link, a link number is written in the link/joint relational table.

For example, for a joint J3 (FIG. 5B) in an analysis model of the contact portion, the position thereof cannot be determined only from the data of the tangential line g1 attained from the CAD diagram. Consequently, the gradient of the line g1 is provisionally written in the joint coordinate table. This table is assumed to be associated with the joint data 215 of FIG. 18. At the same time, a joint number is written in an identification data table to indicate that the data of the joint coordinate table is incomplete. The identification data table is also assumed to be associated with the joint data 215 of FIG. 18. Next, when a joint J4 of the link related to the line g1 and a joint J2 (FIG. 5B) associated with a rotary center of the roller are input, an intersection between a line passing the joint J4 and parallel to the line g1 and a straight line passing through the joint J2 and vertical to the parallel line is defined as a sliding joint J3 (FIG. 5B). Values of coordinates of the point and identification data of the type of joint (sliding type) are stored in the joint coordinate value table and the joint type table, respectively. The joint type table is also formed in the joint data 215 of FIG. 18. Simultaneously, the joint number is deleted from the identification data table indicating incompleteness of the joint coordinate table.

Through the operation described above, constituent data associated with links and joints are determined.

Next, in a step 6, there is selected a joint related to independent variable as input variables to analyze the posture of the mechanism system.

The independent variables are manually selected in response to indication of points in a screen or automatically selected according to the data base containing the selection rules shown in FIGS. 1 and 5.

In the manual selection, for example, according to the external force input program 8 of FIG. 2, the user picks a joint linked with a driving device such as a motor to set the joint to which an external force is applied.

In this case, a point of action of external force (a central line of a shaft directly coupled with the driving device) is chosen for an independent variable.

As a result of the operation described above, there are automatically created data items of an analysis model related to the contact portion.

Next, creation of another analysis model associated with a rolling joint will be described by reference to FIG. 6.

Figure 6:
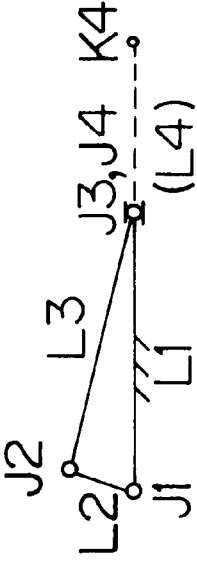
FIG. 6 is a diagram for explaining mechanism parts and examples of analysis models thereof.

For example, a relative movement between a piston and a cylinder is assumed to be attended with a rotation and a sliding or slipping action as shown in (A) of FIG. 6. For the sliding movement, therefore, in accordance with the program 5, the tangential line g1 denoting a sliding location and the piston (link member a3) are specified and then a blank "b" (for a fixed item) is input for the cylinder, thereby obtaining an inclination of the sliding direction. Subsequently, a point denoting a piston pin and the link member a3 (conrod) and the link member a2 (piston) for a linkage are provided so as to set a rotary joint J3. At the same time, a position of the sliding joint J4 is set to the position of the joint J3. Consequently, the link L4 related to the joints J4 and J3 has a length of "0". Since for the length "0", the sliding direction cannot be computed, coordinates of a point K4 in the sliding direction are calculated according to the gradient indicating the sliding direction and coordinates of the joint J4 (J3). FIG. 6(B) shows a case of sliding of the link member (a3). Like in the case of FIG. 6(A), according to the program 5 of FIG. 2, the sliding joint J4 is set as follows. First, where the line g1 denoting the sliding location and link members a2 and a3 are specified, there is obtained an inclination designating the sliding direction. Next, when other joints respectively of the link members a2 and a3 are set, coordinates of the joint J3 are determined as a center of the two joints J2 and J4.

Figure 7A:
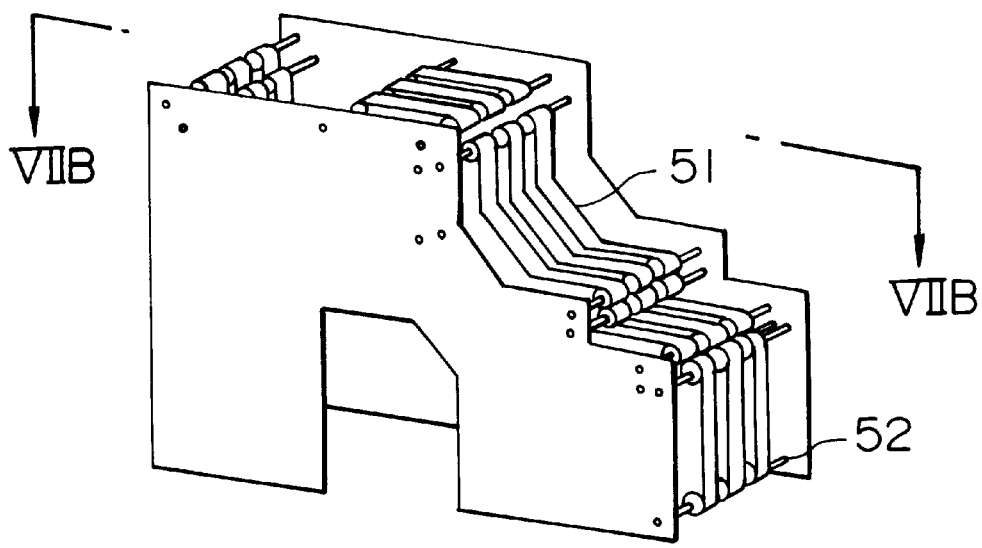
FIG. 7A is a perspective view of a practical example including mechanism parts.
Figure 7B:
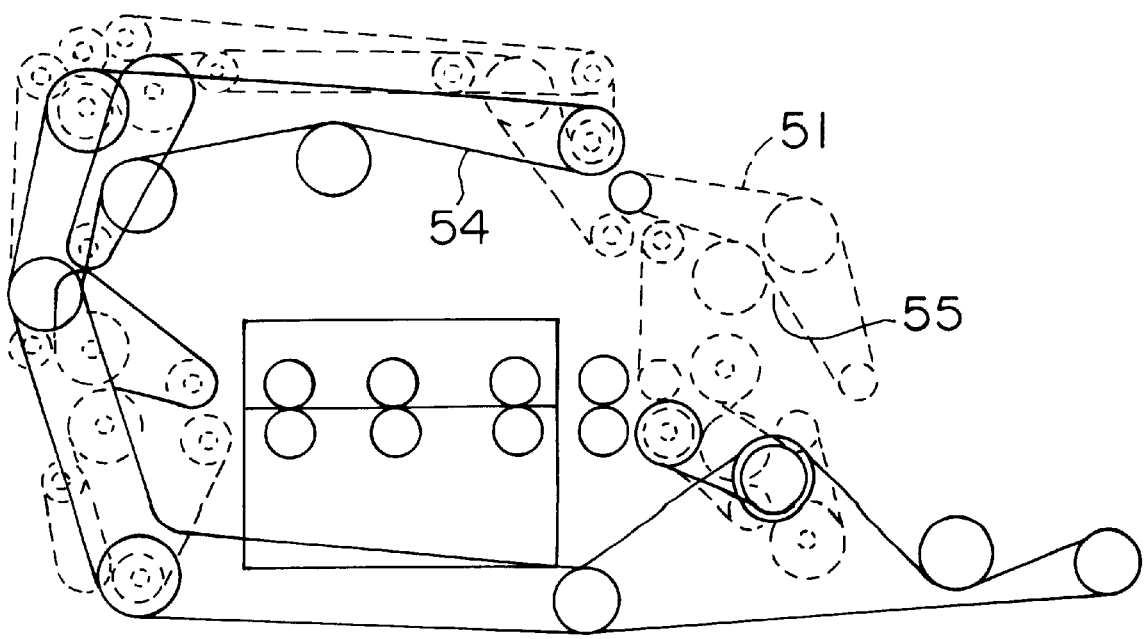
FIG. 7B is a cross-sectional view of the mechanism parts of FIG. 7A along a line VIIB—VIIB.

Subsequently, an example in which the analysis model is applied to an actual product is shown in FIGS. 7A and 7B.

Figure 8:
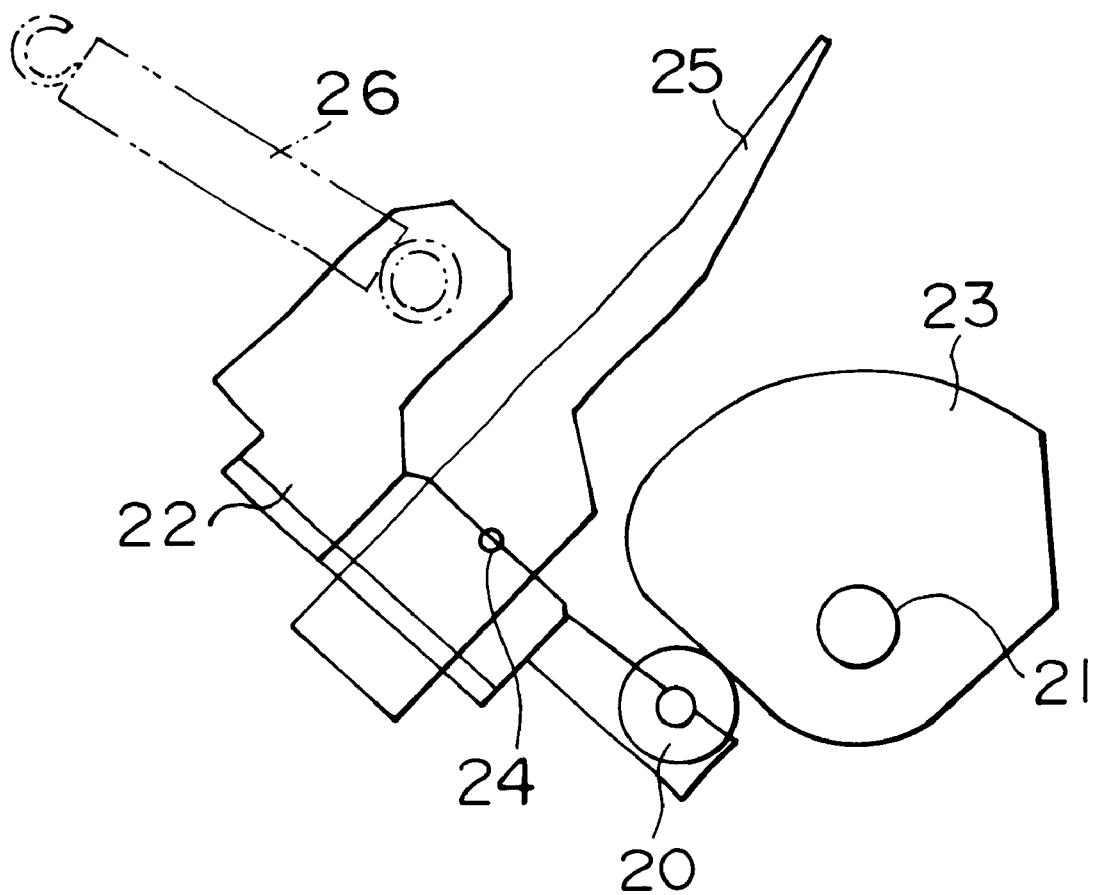
FIG. 8 is a side view showing a portion of the mechanism parts of FIG. 7A.

FIG. 7A is a perspective view of a bank note conveying section of an automatic banking machine, whereas FIG. 7B is a cross-sectional view showing in a CAD diagram of the bank note conveyor. In the teller machine, bank notes are transported by a conveying belt 51 as shown in FIG. 7A. The belt is attached onto a pulley supported on a rod 52 fixedly disposed in a frame. In FIG. 7B, a belt drawn with dotted lines is a conveyor belt 51, whereas a belt shown with solid lines is a driving belt 54. In the note transporting section, the processing varies according to the operation mode of deposit or withdrawal, types of bank notes, the front or rear surface of each note, or acceptability thereof. Consequently, the transporting route has many branch points 55. In each branch point 55, there is accordingly disposed a driving mechanism to change a position of a note transporting guide. In the automatic banking machine, there are additionally employed various mechanism parts such as a mechanism to open and to close a door of a deposit and withdrawal cabinet. According to the compound design system of the present invention, while generating CAD drawings of these parts, behavior thereof is analyzed and efficiency as well as reliability thereof are evaluated. As an example, FIG. 8 and subsequent diagrams show CAD drawings of the note guide change-over mechanism used in a banking terminal facility and an analysis model thereof. In FIG. 8, when a camshaft 21 is rotated, a follower 22 conducts via a cam 23 a swinging action centered on a rotary axis 24. As a result, a guide 22 turns to the right or left to change the note transporting route. On an end opposing to a position where a follower roller (to be simply called a roller herebelow) 20 is attached onto the follower, there is disposed a spring 26 pushing the roller 20 against a surface of the cam 23.

Consequently, this mechanism can be considered to include a cam mechanism including the combination of the cam and the follower and a link mechanism including the follower on which the follower roller 20 is attached and the spring 6. Next, description will be given of creation of an analysis model according to the constitution set forth above.

An operation to generate a link model of the cam mechanism and an automatic operation to create analysis model data will be now described by reference to FIGS. 9, 10, 11A, and 11B.

Since the cam does not include the link, a combination of the cam and the roller is set according to the program 7. FIG. 9 shows an example of shapes of equivalent link models of parts other than the links. The data base of mechanical part types is included in the data base e5 of FIG. 1. The parts other than the links include springs, solenoids, combinations of roller/link, and combinations of roller/cam, etc. It may also be possible to dispose a menu of only representative types of parts (for example, a group of commands on a display) such that when a part type missing in the menu becomes necessary, the designer arbitrarily adds such a part type thereto. Moreover, as for analysis models for various kinds of parts, only connected states of joints and links are stored in the mechanical part type data base such that coordinate values of pertinent joints are automatically supplied when a drawing is input. Furthermore, the menu presents item names such as names of a spring and solenoid of FIG. 9 or an outline drawing.

Figure 10:
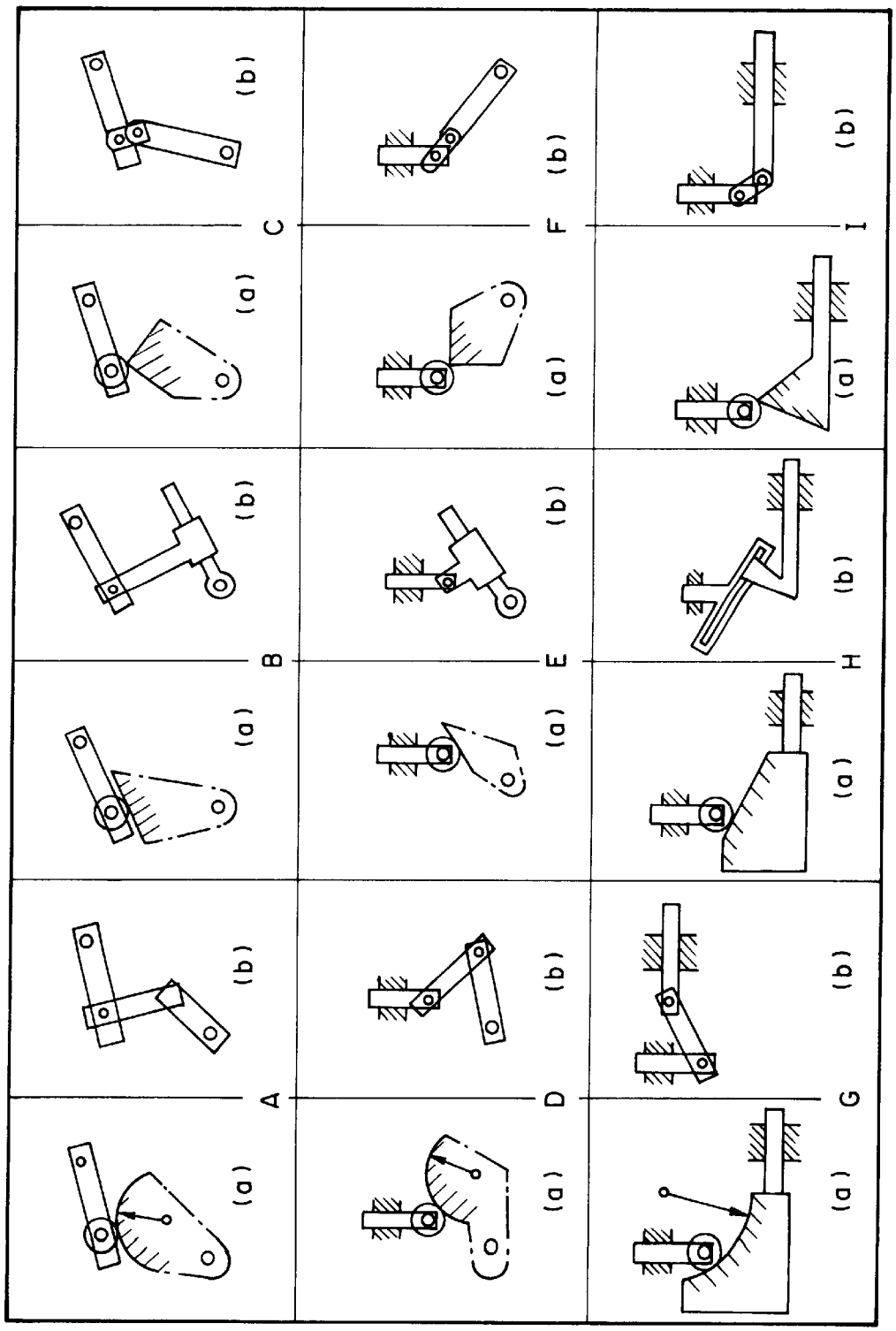
FIG. 10 is a diagram for explaining examples of data of parts of a cam-roller mechanism stored in a data base.

Subsequently, FIG. 10 shows various combinations of cam shapes and rollers (a) and equivalent link mechanism models (b) respectively associated therewith. As can be seen from this diagram, an equivalent link model is assigned to each shape of the contour line of the cam. This example includes nine types of models A to I. The models A to C are related to the case where the cam and the follower rotate, the models D to F are associated with a case where the cam rotates and the follower conducts an action along a straight line, and the models G to I are applied to a case where the cam and the follower each achieve an action along a straight line. For the link models A, D, and G, the contour line of cam is a circle; for the models B, E, and H, the contour line is straight, and for the models C, F, and I, the contour line includes an angular corner. In general, the contour line includes a circular line, a straight line, and an angular corner. Consequently, in a cam/roller combination, for a rotation of the cam, it is required to employ a plurality of link models. However, in this embodiment, since any part can be analyzed by an analysis program associated with a unified data structure, the analysis can be easily extended to various kinds of parts. In addition, it is also possible to adopt a general-purpose method for the automatic generation of an analysis model.

Figure 11A:
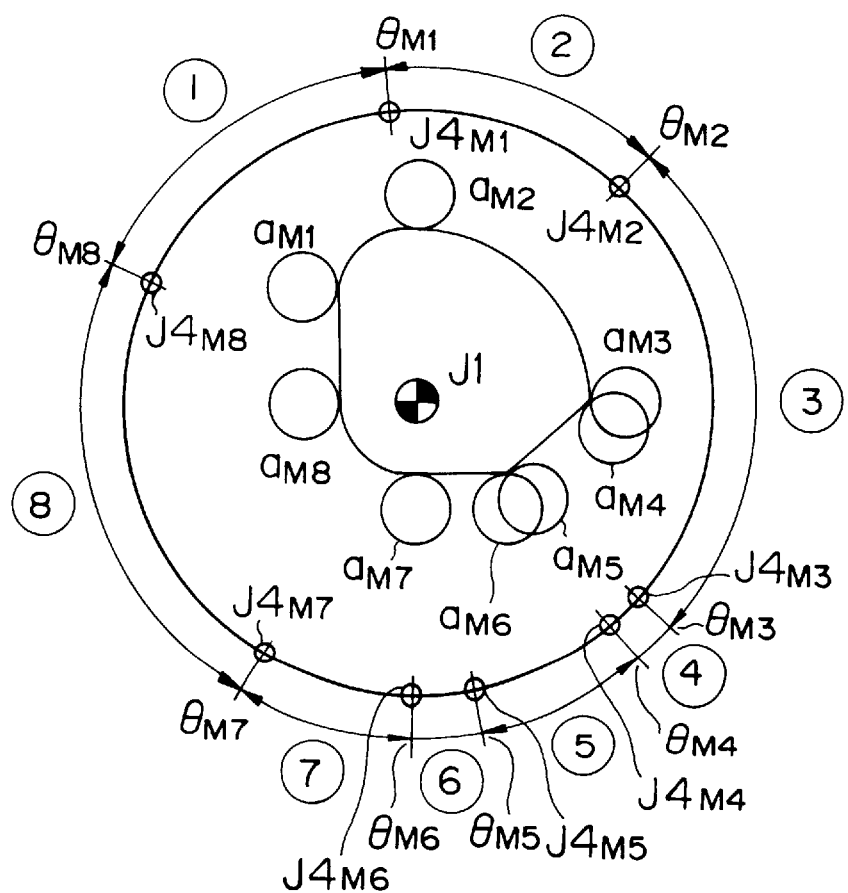
FIGS. 11A and 11B are diagrams used to explain data items used to produce an analysis model of the mechanism parts shown in FIG. 8.
Figure 11B:
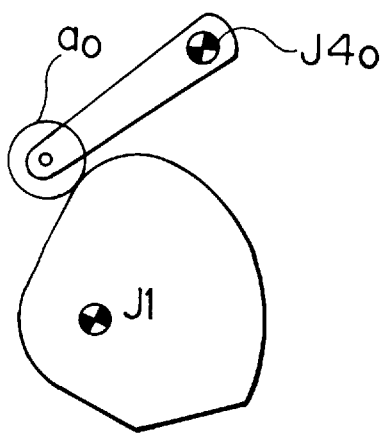

Referring next to FIGS. 11A and 11B, description will be given of a change-over position of an analysis model. FIG. 11B shows a CAD drawing of a roller-cam combination, whereas FIG. 11A shows analyzing states to generate an analysis model of the roller-cam combination. That is, in FIG. 11A, there are specifically shown changes of relative positions between a center of the roller, a center of a camshaft, and a center of a rotary shaft of a follower with the center of camshaft kept fixed. Reference numerals to ① to ⑧ stand for model numbers, each of $\theta_{M1}$ and $\theta_{M2}$ denotes an angular displacement of revolution of the center of the rotary shaft of the follower about the center of the camshaft at a model change-over point, and each of $J4_{M1}$ and $J4_{M2}$ designates a relative position of the center of the rotary shaft of the follower with respect to the center of the camshaft. Actually, due to rotations of the cam, the center of the roller in each analysis model and the position of a joint generated in the equivalent model conduct rotary actions through the respective models until the center of the rotary shaft of the follower matches a fixed point indicated in the drawing, thereby determining values of coordinates for the joints in each model.

Figure 12:
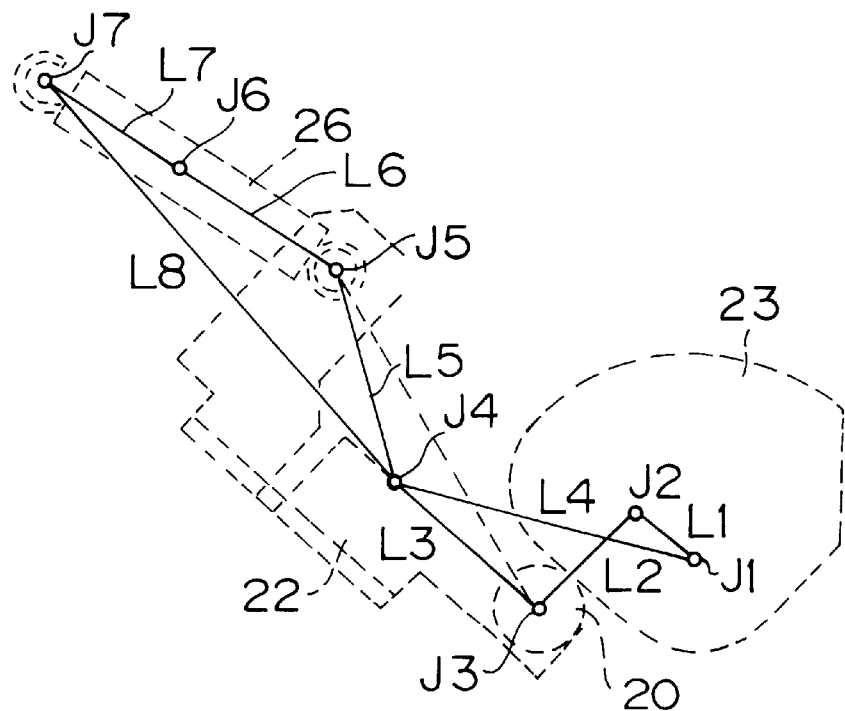
FIG. 12 is a diagram showing an example in which the mechanism parts are drawn with dotted lines and an analysis model created from the parts is drawn with solid lines.

Next, description will be given of a procedure to actually generate an analysis model from a CAD drawing and to analyze the model. FIG. 12 shows an analysis model created according to the CAD diagram of FIG. 8.

First, description will be given of creation of an analysis model of the cam mechanism shown in FIG. 8 according to the method described in conjunction with FIGS. 9, 10, 11A, and 11B. From the image of the cam shown in the form of a data base in the CAD drawing of FIG. 9, there is selected a cam mechanism similar to that shown in FIG. 8. Specifying the center of the camshaft 21 to FIG. 8, the user inputs from the keyboard a letter "b" for blank as shown in FIG. 3B. This designates the image of the cam of FIG. 8 such that the joint J1 corresponding to the center of the camshaft 21 is set as a fixed point as shown in FIG. 12. Next, the user designates a contour line of the cam 23 being in touch with the roller 20 and a graphic image of the roller 20. Accordingly, the links L1 and L2 and the joint J2 are established in the link model in this posture. Subsequently, the joint J4 is denoted according to the program 5. The user then inputs a blank "b" and indicates a follower 22 so as to set the link L3 and the joint J4 (fixed point) of the link model.

Thereafter, for the link mechanism of FIG. 8, the program 7 is first activated to select data of the spring presented in the data base of FIG. 9. Moreover, according to the program 5, the user indicates a joint J5 and then specifies the follower 22 and a spring 27 to set the links L5 and L7 and the joint J6. Designating the joint J7, the user inputs a blank "b" and indicates the spring 27 so as to determine the joint J7 to serve as a fixed point.

When the data items above are thus set, an analysis model is automatically produced as described in conjunction with FIGS. 3A to 3C. Since the cam and the spring are parts of mutually different types, there is utilized the processing route RT1 of the analysis model generating procedure shown in FIG. 4. Namely, in the step 1, the parts are determined to belong to different types. In step 4, a retrieval is made through the data base. In step 5, various necessary tables are created. The steps 6 and 7 will be described later.

For the cam, as already described by reference to FIGS. 9, 10, 11A, and 11B, data items are automatically generated in association with the contour line of the cam according to the parts type identification data. Moreover, for the spring, there are automatically created two links L6 and L7 aligned on a straight line and coupled with each other by a rolling joint. The link L3 related to the joints J3 and J4 and the link L5 associated with the joints J3 and J5 are produced for a model of an identical member, namely, the follower 22. Consequently, an identification flag is established to indicate that these items conduct a unanimous movement as an integrated body.

Figure 13:
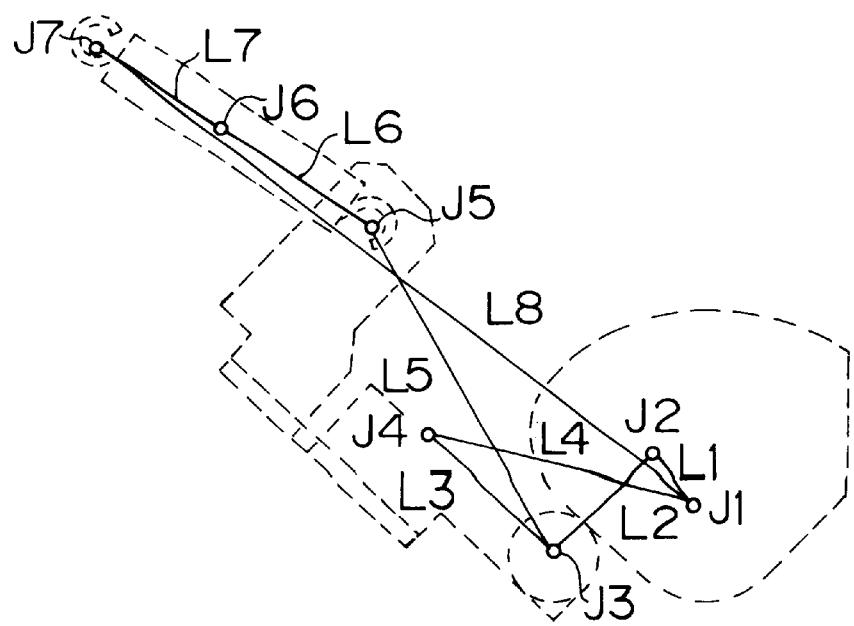
FIG. 13 is a diagram showing another example in which the mechanism parts are drawn with dotted lines and an analysis model created from the parts is drawn with solid lines.

As a result of the operation above, data items of the links L4 and L8 are created. FIG. 13 shows a profile of an analysis model equivalent to that of FIG. 12.

Figure 14:
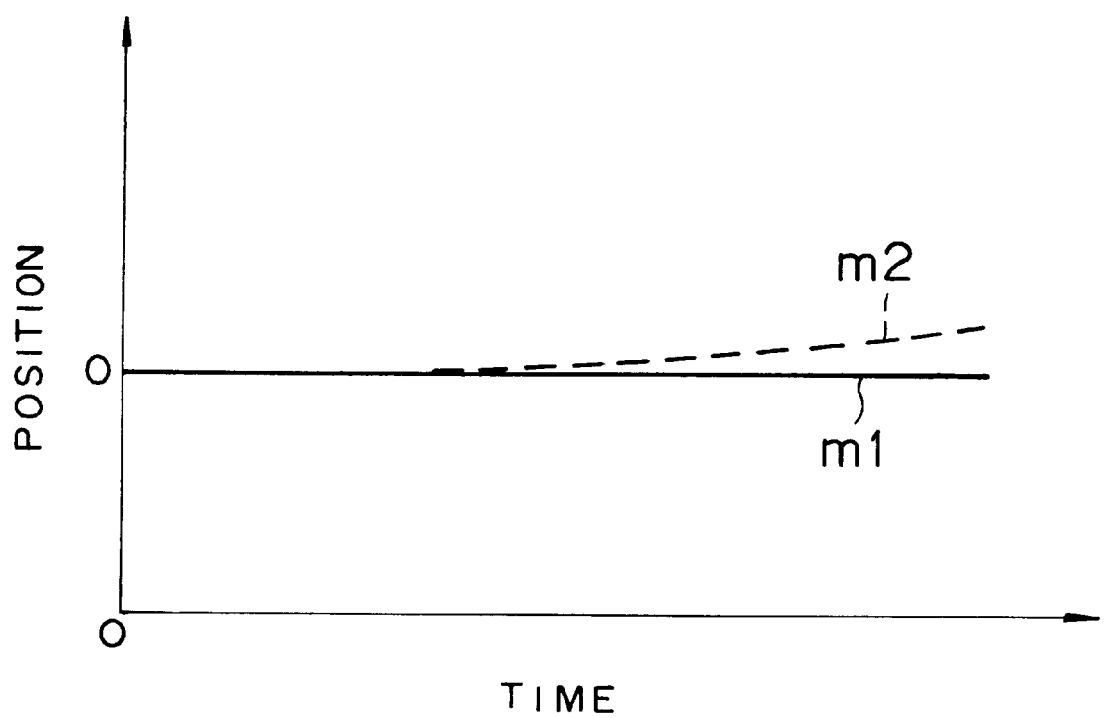
FIG. 14 is a graph showing a positional change of a fixed point of a joint obtained as a result of a dynamic analysis of the analysis models of FIGS. 12 and 13.

Namely, in FIG. 12, the links L3 and L5 and the link L7 having the joints J3 and J5 respectively at the ends thereof configure a triangle, which unanimously achieves a united movement as described above. Consequently, as for mechanism analysis, investigation of movement of the link L7 is equivalent to investigation of that of the link L5. There is obtained an analysis model including the links L3 and L7 and the joints J3 and J5 as a result. FIG. 14 comparatively shows results of behavior analyses achieved according to these equivalent analysis models. As can be seen from this graph, in the analysis model of FIG. 13, there does not occur any shift of the fixed point of the joint J4 as denoted by a characteristic m1; however, in the analysis model of FIG. 12, there occurs a shift of the fixed point of the joint J4, which increases with the lapse of time, as denoted by a characteristic m2.

In FIGS. 12 and 13, the analysis model of the note guide change-over mechanism includes two four-bar link mechanisms. Moreover, since each of the links L3 and L5 and the links L3 and L7 moves in a unanimous manner, when the posture of one of the link mechanisms is determined, the posture of the other one thereof is also decided. Consequently, there is obtained a mechanism having a high degree of freedom such that when an angle or a sliding amount is specified for either one of the joints, it is possible to compute the posture of the four-bar link mechanism. The joint variables including the angle and the sliding amount thus specified are called independent variables. In the analysis models of FIGS. 12 and 13, the joint J1 is selected as the center of the camshaft for an independent variable because the posture of the cam with respect to its rotary angle may set to a value ranging from 0° to 360°. Consequently, after a dynamic analysis is carried out according to the independent variable, it is unnecessary to determine whether or not the joint satisfies the operation range, thereby minimizing the analysis time. Selection of independent variables is related to the mechanism analysis and hence is required to be automatically determined by the system. In the embodiment, the joint J1 is selected as the center of the camshaft for the independent variable according to the part type data.

Figure 16A:
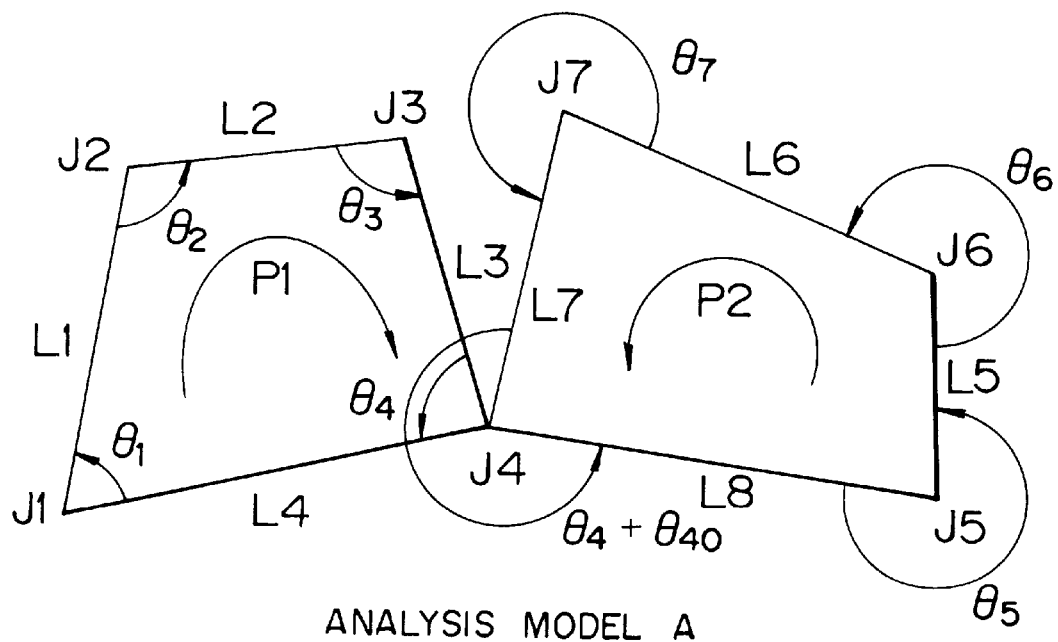
FIGS. 16A and 16B are diagrams used to explain two four-bar link mechanisms cooperating with each other.
Figure 16B:
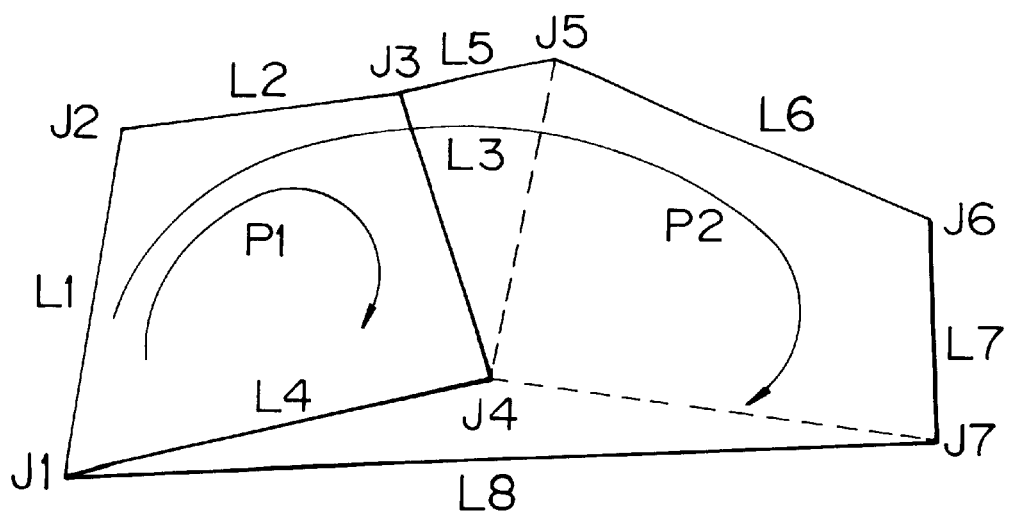

Next, conditions to select a joint for independent variables will be described by reference to FIG. 15 showing selection rules of independent variables. As set forth above, the cam is related to an example of a joint having a wide operation range. Namely, since the camshaft has a rotation range up to 360°, the joint J1 is selected as the center of the camshaft for an independent variable. This is a case of a simple four-bar link as an example of a joint which can be set as a driving point. Depending on the posture of each link mechanism and the type of each joint constituting the link mechanism, there may appear a joint which cannot be used as a driving point. Such a joint cannot be selected for an independent variable which initially undergoes a displacement. In general, a load is applied to such a joint which can be driven. Consequently, in the system, a joint corresponding to an input load point can be automatically chosen for an independent variable. In consideration of a case where common points of loops are selected as independent variables of joints, the independent variables of the analysis model of the mechanism parts shown in FIG. 12 are contained only in a loop P1, whereas those of the analysis model of FIG. 13 are contained in the loops P1 and P2. This is because a high-precision analysis model is to be attained in the case of FIG. 13. FIGS. 16A and 16B also show examples of high-precision analysis models. An independent variable is a start point of analysis. For example, when the common point of loops is set as an independent variable of the joint as shown in FIG. 15, the independent point J4 is used as a point to start the analysis. The operation to set the independent variable is executed by the step of FIG. 4, whereas automatic production of an analysis model is accomplished by the step 7 thereof.

Description will now be given of a posture calculation conducted with two-dimensional vectors according to the method of least squares by J. J. Wicker et. al.

FIGS. 16A and 16B respectively show analysis models A and B of two four-bar link mechanisms cooperating with each other. Referring to FIG. 16A, the configuration of joints and links of the analysis model A will be described. Two links L3 and L7 coupled with each other at a joint J4 are assumed to rotate in a unanimous fashion as an integrated body. Accordingly, two four-bar link mechanisms cooperate with each other. Moreover, each joint of the mechanisms is assumed to be a rotary joint. The constitution includes a loop p1 related to the links L1 to L4 and a loop p2 associated with the links L5 to L8. An inclination of each link is expressed by an angle $\theta_i$ of an output link relative to an input link in a joint associated therewith. In consideration of the loop direction, a link proceeding toward a joint is called an input link, whereas a link extending from joint is called an output link. Since each loop is closed, the values of angle $\theta_i$ hold the following relationships.

$$l_1 \cos \theta_1 + l_2 \cos \theta_2 + l_3 \cos \theta_3 + l_4 \cos \theta_4 = 0 \quad (1)$$

$$l_1 \sin \theta_1 + l_2 \sin \theta_2 + l_3 \sin \theta_3 + l_4 \sin \theta_4 = 0 \quad (2)$$

$$\theta_1 + \theta_2 + \theta_3 + \theta_4 = 2\pi \quad (3)$$

$$l_5 \cos \theta_5 + l_6 \cos \theta_6 + l_7 \cos \theta_7 + l_8 \cos(\theta_4 + \theta_{40}) = 0 \quad (4)$$

$$l_5 \sin \theta_5 + l_6 \sin \theta_6 + l_7 \sin \theta_7 + l_8 \sin(\theta_4 + \theta_{40}) = 0 \quad (5)$$

$$\theta_5 + \theta_6 + \theta_7 + \theta_4 + \theta_{40} = 6\pi + \theta_{40} \quad (6)$$

Assuming the joint J1 specified for an independent variable, the values of $\theta_1$ are known and hence it is only necessary to compute the values of variables $\theta_2$ to $\theta_7$. To obtain solutions in a general manner, Tailor expansion is achieved for each of the expressions (1) to (5) for linearization of each loop so as to attain expressions (7) to (10).

$$(l_2 \sin \theta_{S2})d\theta_2 + (l_3 \sin \theta_{S3})d\theta_3 + (l_4 \sin \theta_{S4})d\theta_4 = l_1 \cos \theta_1 + l_2 \cos \theta_{S2} + l_3 \cos \theta_{S3} + l_4 \cos \theta_{S4} \quad (7)$$

$$(l_2 \cos \theta_{S2})d\theta_2 + (l_3 \cos \theta_{S3})d\theta_3 + (l_4 \cos \theta_{S4})d\theta_4 = -l_1 \sin \theta_1 - l_2 \sin \theta_{S2} - l_3 \sin \theta_{S3} - l_4 \sin \theta_{S4} \quad (8)$$

$$(l_5 \sin \theta_{S5})d\theta_5 + (l_6 \sin \theta_{S6})d\theta_6 + (l_7 \sin \theta_{S7})d\theta_4 + (l_8 \sin(\theta_{S4} + \theta_{40}))d\theta_4 = l_5 \cos \theta_{S5} + l_6 \cos \theta_{S6} + l_7 \cos \theta_{S7} + l_8 \cos(\theta_{S4} + \theta_{40}) \quad (9)$$

$$(l_5 \cos \theta_{S5})d\theta_5 + (l_6 \cos \theta_{S6})d\theta_6 + (l_7 \cos \theta_7)d\theta_4 + (l_8 \cos(\theta_{S4} + \theta_{40}))d\theta_4 = -l_5 \sin \theta_5 - l_6 \sin \theta_{S6} - l_7 \sin \theta_{S7} - l_8 \sin(\theta_{S4} + \theta_{40}) \quad (10)$$

In the expressions, $\theta_{Si}$ and $d\theta_i$ stand for an approximated value and a correction value, respectively.

Solutions $d\theta_i$ of the system of the simultaneous equations above are assigned to the approximated values $\theta_{Si}$ to improve the precision of the coefficients thereof. Repeatedly achieving the operation, when the solutions $d\theta_i$ of the equations become to be about "0", there are obtained the values $\theta_{Si}$.

Description will now be given of the precision of the expressions (7) and (8) related to the loop p1 and that of the expressions (9) and (10) associated with the loop p2.

In the loop p1, an exact value $\theta_1$ is supplied as input data; whereas, in the loop p2, the approximated solution $\theta_{S4}$ attained in the loop 2 is employed as input data. Consequently, the precision of the variables of the loop 2 is lower than that of the variables of the loop p1. In FIG. 16B, the analysis model B includes another example of loops.

For the reasons set forth above, as compared with the case of FIG. 12 in which the independent variables are contained only in the loop p1, the case of FIG. 13 in which the independent variables are contained in the loops p1 and p2 develops a higher precision.

Figures 17A, 17B:
FIGS. 17A and 17B are diagrams for explaining examples of selection rules for an optimal loop form of a link mechanism.

According to this embodiment, there is disposed a function in which a check is made, through a retrieval for loop profiles, to decide whether or not independent variables are contained in each loop, thereby creating an equivalent link if necessary. On the other hand, in a loop structure in which independent variables are contained in each loop, the number of links becomes great in each loop and hence the computation time is accordingly increased in some cases. Moreover, in a case where a static analysis is to be carried out or where multiple models are not used in an analysis, the calculation error is small, and hence an independent variable need not be contained in each loop. Under this condition, there are disposed rules as shown in FIGS. 17A and 17B for various cases to determine an optimal loop configuration. According to this diagram, for the calculation conditions of cases C1 to C5, there are selected loop conditions D1 and D2 of FIG. 17B. For example, when the number of loops is small (i.e., the calculation error is small) and the computation time is limited, there is selected a case including a small number of links in a loop to minimize the computation time.

FIG. 18 shows in a block diagram the contents of the storage e4 of FIG. 1A. The storage e4 includes a data structure representing relationships between analysis models, attributes thereof, CAD drawings, types of parts of mechanisms. For example, as already described in conjunction with FIGS. 3A to 3C, the link/joint relational table, the two-dimensional coordinate value table, the identification data table, and the joint coordinate value table used in the creation of analysis models are stored in the link data 213 and the joint data 215. The loop/link relational table is stored in the loop data 212 and the link data 213. Moreover, the attribute data table is stored in the attribute data 217.

A fundamental analysis model to be memorized is related to an equivalent link mechanism and includes data items of loops, links, and joints. Furthermore, in a case where behavior of an arbitrary point of a link part other than the joint is to be investigated, a number assigned to the point and coordinate values thereof are stored as auxiliary point data in the link/joint relational table of the joint data 215. The attribute data table includes the attribute data 217, for example, a moment of inertia for a link, a type of joint (e.g., rotating or sliding type), a driving force, a spring constant, and an operation range for a joint. Drawing control data 100 controls such items as a part diagram 110 extracted from a manufacturing diagram and includes a drawing number or name of the mechanism part. The drawing is associated with an analysis model according to a drawing/analysis model relational data table 130.

Analysis model control data 120 includes a name and an analysis model number for each analysis model; moreover, as subordinate data, there are included analysis model data 121, drawing related data 122, and analysis related data 123. These data items are configured in the respective data tables.

The analysis model contour data includes profile data and attribute data. The profile data includes, in a hierarchic structure, sub-model data 211, loop data 212, link data 213, and joint data 215. Thanks to the submodel data 211, the data configuration is applicable to a part such as a cam which requires a plurality of models. Moreover, for a cam, when a roller moves along a straight portion of the contour line thereof, a point along the moving direction is specified as a fixed point on a link corresponding to the straight portion. Consequently, under the link data 213, there are required auxiliary point data 214 in addition to the joint data 215. Attribute data 217 is controlled according to attribute control data 216.

Figure 19:
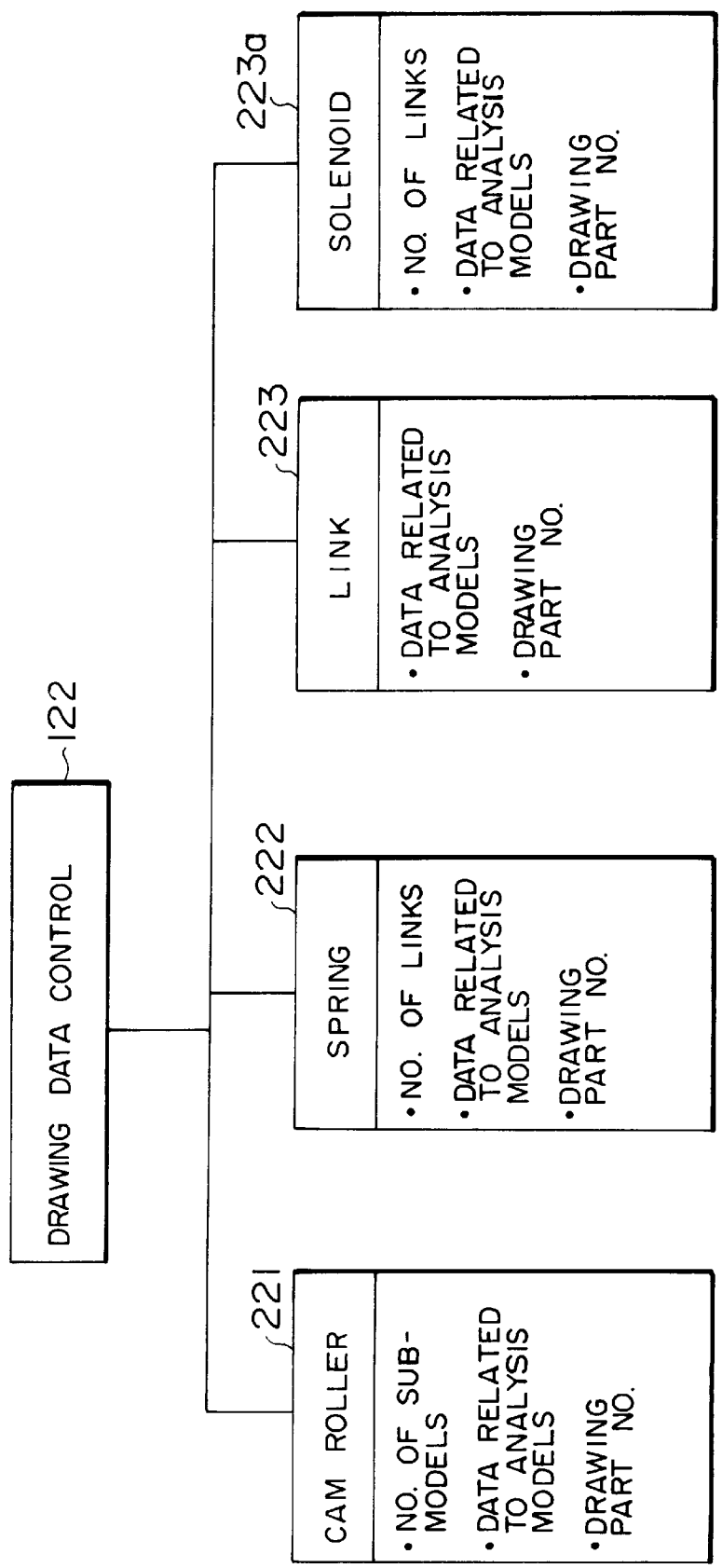
FIG. 19 is a diagram showing the data structure of data related to drawings.

Furthermore, as shown in FIG. 19, the drawing related data 122 relates individual parts in a drawing to an analysis model. For example, a table establishing respective correspondence between numbers assigned to parts and those assigned to links is implemented in cam/roller data 221, spring data 222, solenoid data 223a, and link data 223. In addition, since a cam/roller combination needs a plurality of models, there is disposed a relational table indicating relationships between submodel profiles and part numbers. Furthermore, for a spring, according to an equivalent link model profile related to a part type other than the link as shown in FIGS. 7A and 7B, there is disposed, for a part number of the drawing, data associated with two link numbers.

In addition, the analysis related data 123 indicates relationships between analysis results and an associated analysis model. According to the data 123, results of the analysis of the trace obtained from the analysis model are classified into data 231 representing traces of movement of parts in the drawing and data 232 representing a graph image. For displaying the trace, according to the data 231 of the relational table associated with the analysis model and results and the drawing related data 122, positional data of each joint retrieved from the analysis result data table 300 is converted into coordinates, thereby displaying a graphic image of the trace of the part. In the locus display, correspondence between the respective parts and links of the analysis model vary depending on types of parts. For example, a plurality of analysis models correspond to a graphic image of a cam. Moreover, in a case where a plurality of parts move as an integrated body in a unanimous manner, a link of the analysis model corresponds to a plurality of graphic images of parts.

As set forth above, with provision of various data items and data tables, for a mechanism system including links and other mechanism parts, it is possible to display analysis results according to a CAD diagram. Furthermore, for any mechanism parts having various contours, there is employed a link mechanism analysis model (associated with loops, links, and joints) as a basic element for analysis, analysis models can be automatically created in a general manner.

Next, the data base e5 of FIG. 1A will be described. In the data base e5, there are stored data of other mechanism parts of types other than links and equivalent link mechanism models shown in FIG. 9 and condition data of joints for selection of independent variables shown in FIG. 15. These data items are used, for example, to create an analysis model as described above.

Figure 20A:
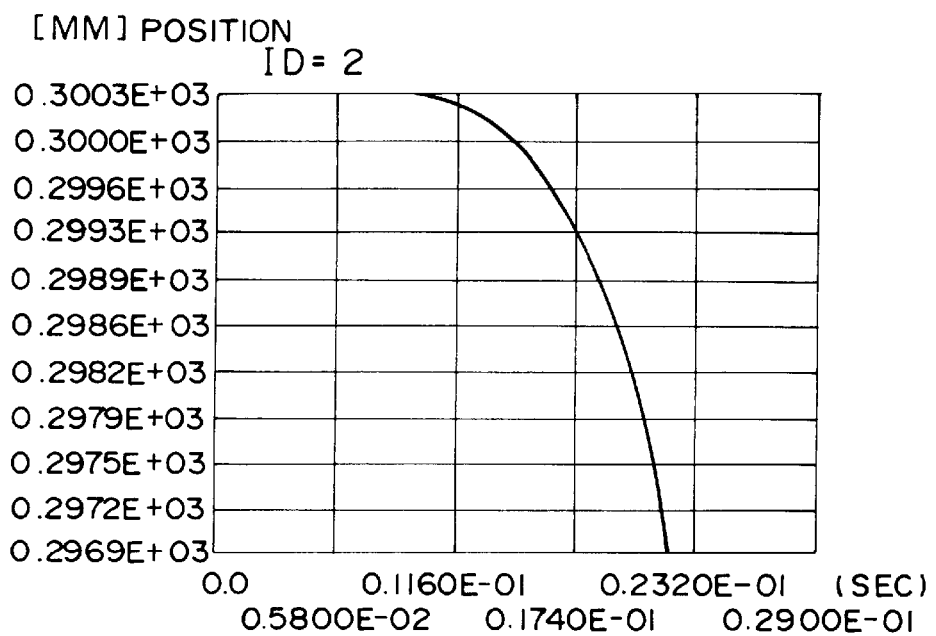
FIGS. 20A and 20B are graphs showing analysis results obtained from analysis models.
Figure 20B:
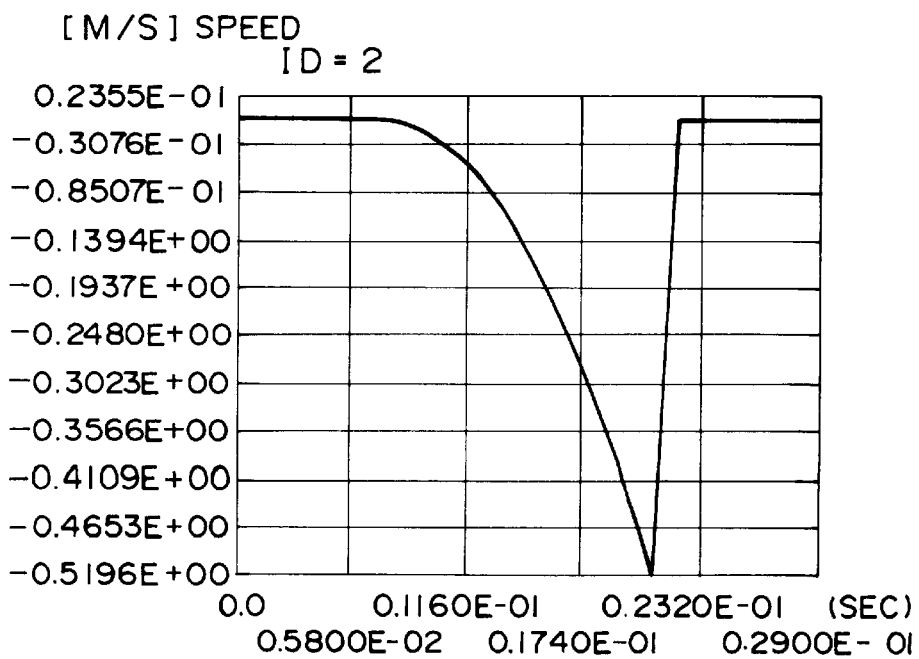
Figure 21A:
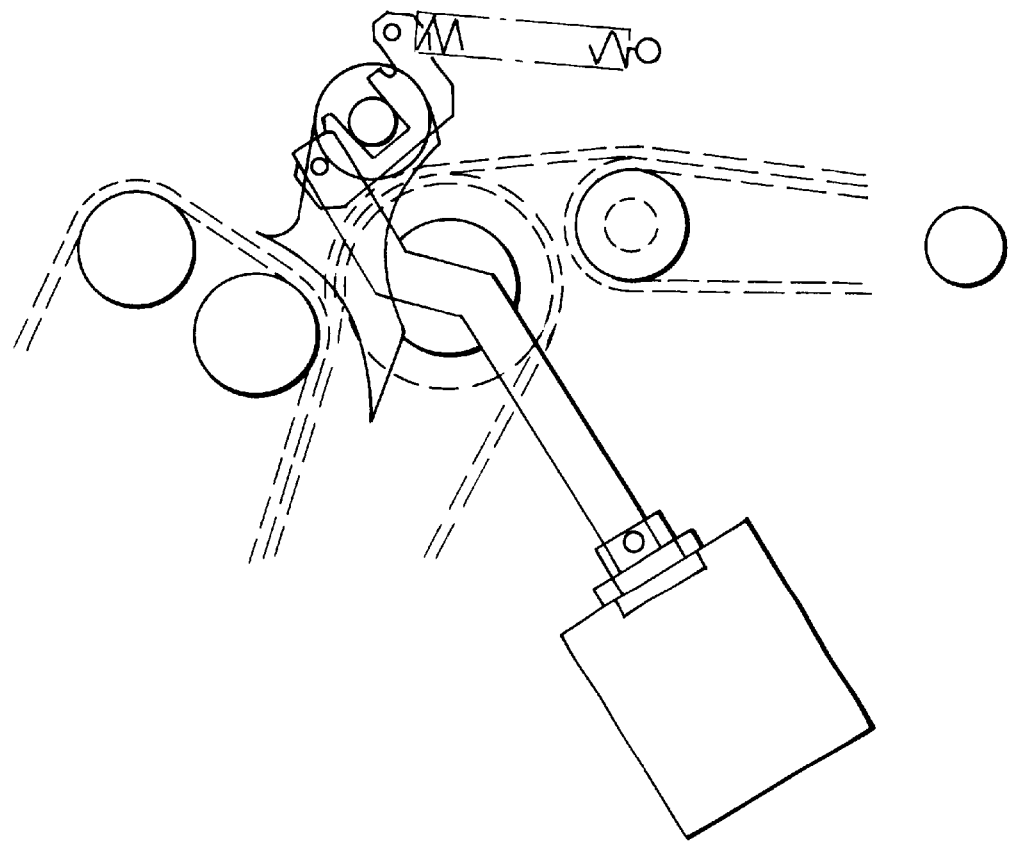
FIG. 21A is a diagram for explaining mechanism parts generated from the analysis results.
Figure 21B:
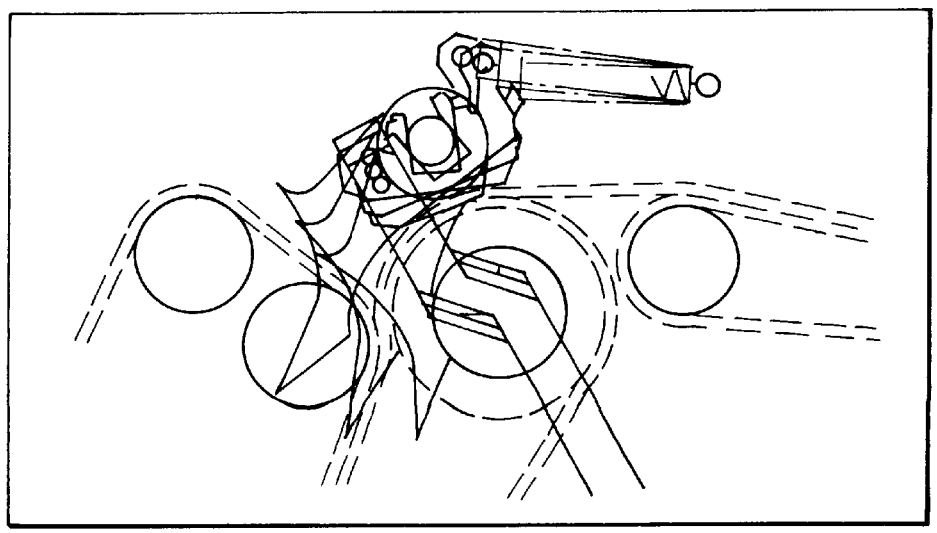
FIG. 21B is a diagram used to explain a locus of behavior created according to the analysis results.

An analysis model thus produced is transformed into analysis data items so as to analyze the model. Moreover, results of the analysis are converted into data items of a CAD drawing by the analysis evaluation part e34 (FIG. 1A). The data items are sent to the display part e1 to be displayed as a graphic image (in a time history response diagram representing positions, speeds, acceleration values, reaction forces, etc. of the respective joints) as the analysis results as representatively shown in FIGS. 20A and 20B. Alternatively, there may be displayed a mechanism part diagram of FIG. 21A or a locus diagram of behavior of mechanism parts of FIG. 21B. The design engineer modifies, for example, profiles of mechanism parts in the CAD drawing and then executes again an analysis for confirmation. Namely, the analysis can be easily evaluated while creating a design drawing so as to fully examine efficiency and strength of each element, which reduces corrections to be conducted after the drawing is once generated. As a result, the design efficiency is improved.

While particular embodiments of the invention have been shown and described, it will be obvious to those skilled in the art that various changes and modifications may be made without departing from the present invention in its broader aspects.

What is claimed is:

1. A compound design system, comprising:
   a drawing apparatus;
   a compound design apparatus for achieving a mechanism analysis of a compound mechanism system of different mechanism parts according to the drawing apparatus and processing result of the mechanism analysis, wherein said compound design apparatus includes:
   analysis model generating means for automatically generating an equivalent link mechanism analysis model from contours of mechanism parts drawn, wherein the analysis model generating means generates a link mechanism model including an optimal loop with respect to an analysis precision and an analysis time according to a profile of a link and a posture thereof,
   analysis evaluating means for converting the equivalent link mechanism analysis model into data for an analysis and converting results of the analysis into two-dimensional data,
   analyzing means for executing a mechanism analysis, and
   drawing evaluating means for generating data for modifications of results of the analysis and the mechanism parts drawn, respectively.

2. A compound design system including a drawing apparatus for drawing at least machine parts and a compound design apparatus for analyzing the machine parts according to drawings of the machine parts, wherein the compound design apparatus includes, at least:

display means for displaying thereon a drawing, data base means for storing therein reference data for analysis of the drawing, wherein the data base means at least stores therein independent variable selection rules respectively represented by at least an angle and a sliding amount related to joints of different type link mechanism parts, cam/roller mechanism parts, and the link mechanism parts, store means for storing therein drawing analysis data, and computing means connected to the drawing apparatus for analyzing the drawing; and the computing means includes:

drawing evaluating means for extracting a graphic image of a particular mechanism part from the drawing received from the drawing apparatus and evaluating the graphic image, analysis model generating means for generating, according to a profile of the graphic image, an analysis model having a mechanism equivalent to the graphic image, analyzing means for reading mechanical characteristic data from the data base means, supplying the data to the analysis model, and executing a mechanism analysis, and analysis results evaluating means for evaluating analysis results obtained from the analyzing means, the analysis results evaluated by the analysis results evaluating means being supplied to the drawing evaluating means, thereby evaluating the graphic image of the mechanism part.

3. A compound design system according to claim 2, wherein the analysis model generating means selects, when structure data can be extracted from the mechanism part graphic image, independent variables stored in the data base means in association with the structure data thus extracted, extracts data of link mechanism parts associated with the independent variables, and generates an analysis model having a mechanism equivalent to the data of link mechanism parts.

4. A compound design system according to claim 2, wherein the analysis model generating means conducts, when structure data cannot be extracted from the mechanism part drawing, a retrieval for a mechanism part graphic image similar to the mechanism part graphic image stored in the data base means, generating a structure data according to the mechanism part graphic image thus selected as a result of the retrieval, selects independent variables stored in the data base means in association with the structure data, extracts data of link mechanism parts associated with the independent variables; and generates an analysis model having a mechanism equivalent to the data of link mechanism parts.

5. A compound design method of conducting, according to a drawing of machine parts produced by a drawing apparatus, an analysis of the machine parts by a compound design apparatus, comprising the following steps of:

a) extracting a graphic image of a particular mechanism part from the drawing created by the drawing apparatus;

b) generating according to a profile of the graphic image an analysis model having a mechanism equivalent to the graphic image, wherein the step b) includes the steps of:

selecting, when structure data can be extracted from the mechanism part graphic image, independent variables stored in a data base means in association with the structure data thus extracted, the independent variables being respectively represented with at least an angle and a sliding amount associated with joints of the link mechanism parts, extracting data of link mechanism parts associated with the independent variables, and generating an analysis model having a mechanism equivalent to the data of link mechanism parts;

c) reading mechanical characteristic the data from data base means, supplying the mechanical characteristics data to the analysis model, and thereby executing a mechanical analysis;

d) evaluating analysis results obtained from the step c); and e) correcting the graphic image according to the evaluated analysis results.

6. A compound design method of conducting, according to a drawing of machine parts produced by a drawing apparatus, an analysis of the machine parts by a compound design apparatus, comprising the following steps of:

a) extracting a graphic image of a particular mechanism part from the drawing created by the drawing apparatus;

b) generating according to a profile of the graphic image an analysis model having a mechanism equivalent to the graphic image, wherein the step b) includes the steps of:

conducting, when structure data cannot be extracted from the mechanism part drawing, a retrieval for a mechanism part graphic image similar to the mechanism part graphic image stored in a data base means, generating a structure data according to the mechanism part graphic image thus selected as a result of the retrieval, selecting independent variables stored in the data base means in association with the structure data, the independent variables being respectively represented with at least an angle and a sliding amount associated with joints of link mechanism parts, extracting data of link mechanism parts associated with the independent variables, and generating an analysis model having a mechanism equivalent to the data of link mechanism parts;

c) reading mechanical characteristic the data from data base means, supplying the mechanical characteristics data to the analysis model, and thereby executing a mechanical analysis;

d) evaluating analysis results obtained from the step c); and e) correcting the graphic image according to the evaluated analysis results.

* * * * *